(12) United States Patent
Kobayashi et al.

(10) Patent No.: US 7,009,164 B2
(45) Date of Patent: Mar. 7, 2006

(54) PHOTOELECTRIC CONVERTER METHOD FOR DRIVING PHOTOELECTRIC CONVERTER AND SYSTEM HAVING PHOTOELECTRIC CONVERTER FOR IMAGE FORMATION CONVERTED FROM RADIATION

(75) Inventors: Isao Kobayashi, Atsugi (JP); Noriyuki Kaifu, Hachioji (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/030,876

(22) Filed: Jan. 10, 2005

(65) Prior Publication Data

US 2005/0156115 A1    Jul. 21, 2005

Related U.S. Application Data

(62) Division of application No. 09/842,694, filed on Apr. 27, 2001, now Pat. No. 6,867,469, which is a division of application No. 09/185,717, filed on Nov. 4, 1998, now Pat. No. 6,245,601.

(30) Foreign Application Priority Data

Nov. 4, 1997   (JP)   .................................. 9-301673

(51) Int. Cl.
H01L 27/00    (2006.01)
H01L 27/146   (2006.01)

(52) U.S. Cl. ................ 250/208.1; 250/370.09
(58) Field of Classification Search ..................... None
See application file for complete search history.

(56) References Cited

U.S. PATENT DOCUMENTS

| 4,179,100 A | 12/1979 | Sashin et al. ............... 250/416 |
| 4,689,487 A * | 8/1987 | Nishiki et al. .......... 250/361 R |
| 4,703,169 A | 10/1987 | Arita .......................... 250/211 |
| 4,740,710 A | 4/1988 | Arita .......................... 250/578 |

(Continued)

*Primary Examiner*—Que Le
*Assistant Examiner*—Pascal M. Bui-Pho
(74) *Attorney, Agent, or Firm*—Fitzpatrick, Cella, Harper & Scinto

(57) ABSTRACT

There is provided a photoelectric converter comprising a photoelectric conversion element of a laminated structure comprising a first electrode layer, an insulation layer for blocking the passage of a first carrier and a second carrier, a photoelectric conversion semiconductor layer, an injection blocking layer for blocking the injection of the first carrier to the photoelectric conversion semiconductor layer, and a second electrode layer, wherein a switching means is provided for operating the converter by switching the following three operation modes a) through c) for applying an electric field to each layer of the photoelectric conversion element; a) an idling mode for emitting the second carrier from the photoelectric conversion element, b) a refreshment mode for refreshing the first carrier accumulated in the photoelectric conversion element, and c) a photoelectric conversion mode for generating pairs of the first carrier and the second carrier in accordance with an amount of incident light to accumulate the first carrier. The photoelectric converter has a sufficiently high SN ratio and can be produced at low cost.

7 Claims, 25 Drawing Sheets

U.S. PATENT DOCUMENTS

| | | | |
|---|---|---|---|
| 4,745,488 A | 5/1988 | Kaifu et al. | 358/294 |
| 4,926,058 A | 5/1990 | Iwamoto et al. | 250/578.1 |
| 5,060,040 A | 10/1991 | Saika et al. | 357/30 |
| 5,233,442 A | 8/1993 | Kawai et al. | 358/482 |
| 5,272,548 A | 12/1993 | Kawai et al. | 358/482 |
| 5,317,406 A | 5/1994 | Kobayashi et al. | 348/307 |
| 5,335,094 A | 8/1994 | Kaifu et al. | 358/494 |
| 5,591,960 A | 1/1997 | Furukawa et al. | 250/208.1 |
| 5,591,963 A | 1/1997 | Takeda et al. | 250/214.1 |
| 5,596,198 A | 1/1997 | Perez-Mendez | 250/370.11 |
| 5,812,109 A | 9/1998 | Kaifu et al. | 345/104 |
| 5,812,284 A | 9/1998 | Mizutani et al. | 358/482 |
| 5,841,180 A | 11/1998 | Kobayashi et al. | 257/448 |
| 5,914,485 A | 6/1999 | Kobayashi et al. | 250/208.1 |
| 6,034,406 A | 3/2000 | Kobayashi et al. | 257/435 |
| 6,127,684 A | 10/2000 | Kaifu | 250/370.09 |
| 6,191,411 B1 | 2/2001 | Kaifu | 250/214 R |

\* cited by examiner $V_{rG} \geqq V_D - V_{FB}$ $V_{rG} < V_D - V_{FB}$ $V_{rG} < V_D - V_{FB}$ $V_{FG} < V_D - V_{FB}$, INITIAL
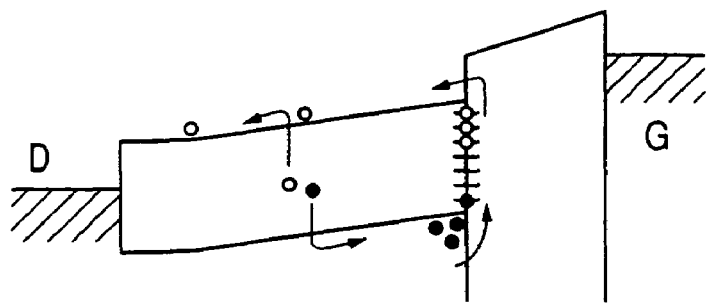
FIG. 18A
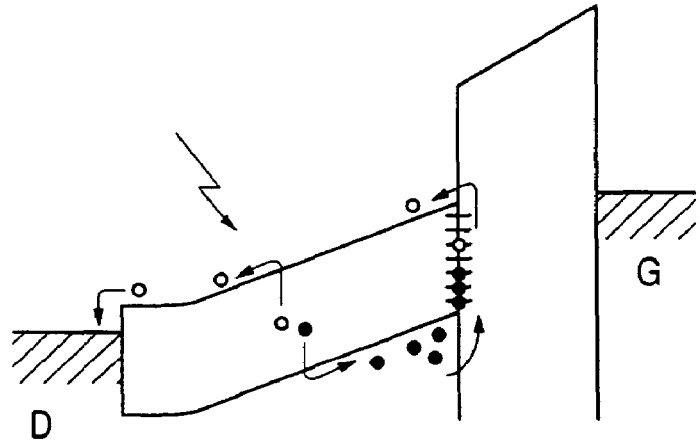
FIG. 18B
FIG. 18C
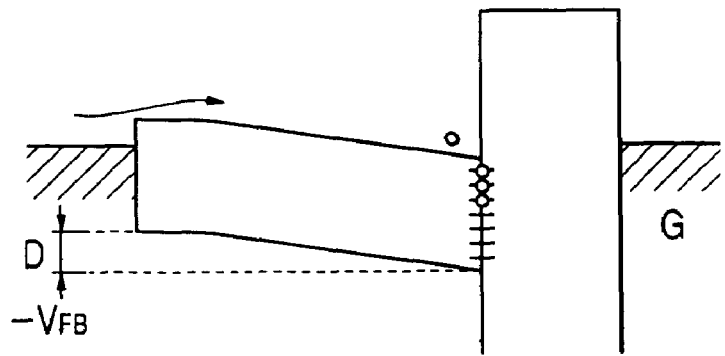

PHOTOELECTRIC CONVERTER METHOD FOR DRIVING PHOTOELECTRIC CONVERTER AND SYSTEM HAVING PHOTOELECTRIC CONVERTER FOR IMAGE FORMATION CONVERTED FROM RADIATION

This application is a division of application Ser. No. 09/842,694, filed Apr. 27, 2001 now U.S. Pat. No. 6,867,469, which is a division of application Ser. No. 09/185,717, filed Nov. 4, 1998, now U.S. Pat. No. 6,245,601, issued on Jun. 12, 2001.

BACKGROUND OF THE INVENTION

1. Field of the Invention

The present invention relates to a photoelectric converter, a method for driving the converter and a system thereof, for example, to a one-dimensional or two-dimensional photoelectric converter capable of reading data of a facsimile machine, a digital copying machine, an X-ray photographing device or the like, a method for driving the converter and a system thereof.

2. Related Background Art

Conventionally, a reading system using a reducing optical system and a CCD sensor has been used as a reading system for a facsimile machine, a digital copying machine, an X-ray photographing device or the like. In recent years, with the development of photoelectric conversion semiconductor materials represented by hydrogenated amorphous silicon (hereinafter represented as "a-Si"), the development of so-called closely laminated type sensors for reading data with an optical system of the same size as the information source by forming a photoelectric conversion element and a signal processing part on a large-area substrate is being targeted. In particular, since a-Si can be used not only as a photoelectric conversion material but also as a thin-film electric field effect type transistor (hereinafter described as a "TFT"), there is an advantage that a photoelectric conversion semiconductor layer and a semiconductor layer for the TFT can be formed at the same time.

FIGS. 1 and 2 are schematic sectional views showing one example of a structure of an optical sensor, respectively. FIG. 1 and FIG. 2 are views schematically showing a structure of a layer of the optical sensor. FIG. 3 is a view showing one example of a representative driving method which is common among optical sensors. FIG. 1 and FIG. 2 are views both showing a photo-diode type optical sensor. FIG. 1 is a view showing a so-called PIN type optical sensor while FIG. 2 is a view showing a so-called Schottky type optical sensor. In FIGS. 1 and 2, reference numeral 1 denotes a substrate having at least an insulated surface, 2 a lower electrode, 3 a p-type semiconductor layer (hereinafter referred to as a "p layer"), 4 an intrinsic semiconductor layer (hereinafter referred to as an "i layer"), 5 an n-type semiconductor layer (hereinafter referred to as an "n layer"), and 6 a transparent electrode. In a Schottky type optical sensor shown in FIG. 2, the material of a lower electrode 2 is appropriately selected so that a Schottky barrier layer is formed to inhibit the injection of electrons from the lower electrode 2 into the i layer 4. In FIG. 3, reference numeral 10 shows an optical sensor which is represented by symbolizing the above optical sensor. Reference numeral 11 denotes a power source. Reference numeral 12 denotes a detecting element of a current amplifier or the like. The direction shown by symbol C in the optical sensor 10 is directed toward the side of a transparent electrode 6 in FIGS. 1 and 2 while the direction denoted by symbol A in the optical sensor 10 is directed to the side of the lower electrode 2, and the power source 11 is set up so that a positive voltage is applied to side C with respect to side A.

Operation of the optical sensor will be briefly explained hereinafter. As shown in FIGS. 1 and 2, light is entered from the direction shown by an arrow. When the light reaches the i layer 4, the light is absorbed and electrons and holes are generated. Since an electric field is applied to the i layer 4 by the power source 11, electrons are moved to the side C, namely to the transparent electrode 6 via the n layer 5 while holes move to side A, namely, to the lower electrode 2. Consequently, a photoelectric current flows through the optical sensor 10. When light is not entered, electrons and holes are not generated in the i layer 4. Furthermore, since an n layer 5 serves as a hole injection blocking layer, the p layer 3 of the PIN type shown in FIG. 1 and the Schottky barrier layer in the Schottky type shown in FIG. 2 serves as an electron injection blocking layer, so that the holes in the transparent electrode 6 and the electrons in the lower electrode 2 cannot be moved, respectively and current does not flow. Consequently, the current is changed depending on the presence or absence of light entrance. When a change in current is detected by the detecting element 12 of FIG. 3, the optical sensor is operated.

However, it is not easy to actually produce at a low cost a photoelectric converter having a sufficient SN ratio using the conventional optical sensor. The reasons will be explained hereinafter.

A first reason is that both the PIN type shown in FIG. 1 and the Schottky type shown in FIG. 2 require an injection blocking layer at two places.

In the PIN type sensor, the n layer 5, which is an injection blocking layer, blocks the movement of electrons to the transparent electrode 6. At the same time, a property to block the injection of holes into the i layer 4 is needed. Furthermore, in the Schottky type sensor, the Schottky barrier layer requires properties for blocking electrons from the lower electrode and for blocking holes from the n layer 5. When either of these properties is lost, the photoelectric current is lowered, and current generated without incident light (hereinafter-referred to as "dark current") increases, which causes a decrease in the SN ratio. This dark current itself is considered to be noise. At the same time, a fluctuation referred to as shot noise, or so-called quantum noise, is included. Even when the detecting element 12 performs a process to subtract the dark current, the quantum noise that accompanies the dark current cannot be reduced. Normally, in order to improve this property, it is required that the film formation conditions for i layer 4 and n layer 5 and the annealing conditions after the preparation of the film be optimized. However, with respect to the p layer 3, which is another injection blocking layer, the same property is required even though the electrons and holes are the opposite. In the same manner, optimization of each condition is required. Normally, the conditions for the optimization of the former n layer and for the optimization of the latter p layer are not the same. It is not easy to satisfy both conditions at the same time. In other words, injection blocking layers having two properties opposite to each other at two places are needed in the same optical sensor, making it difficult to form an optical sensor having a high SN ratio. This is applied to the Schottky type shown in FIG. 2. In the Schottky type shown in FIG. 2, the Schottky barrier layer is used as one of the injection blocking layers. This utilizes the difference between the work functions of the lower electrode 2 and the i layer 4. The material of the lower electrode 2 is restricted, and the influence of the localized level of the interface largely affects the properties. Consequently, it is not easy to satisfy all the conditions in an ideal manner. Furthermore, in order to improve the properties of the Schottky barrier layer, it has been reported that a thin oxide film of silicon or a metal or a nitride film having a thickness of about 100 angstroms or the like may be formed between the lower electrode 2 and the i layer 4. This is intended to use a tunnel effect, introduce holes to the lower electrode 2, and block the injection of electrons to the i layer 4. The difference in work functions is also used here. For this purpose, limitation of the material of the lower electrode 2 is required. Furthermore, the thicknesses of the oxide film and nitride film are restricted to a very thin level of about 100 angstroms because of the use of opposite properties such as the block of the injection of electrons and hole movement caused by the tunnel effect. Furthermore, it is difficult to control the thickness or the film quality, and it is not easy to raise productivity.

In addition, the fact that an injection blocking layer is needed at two places lowers productivity, constituting a factor for cost increases. This is because the injection blocking layer is important in terms of properties, with the result that when a defect is generated by dust or the like at one of the two places, the properties of an optical sensor cannot be obtained.

The second reason will be explained by referring to FIG. 4. FIG. 4 is a view showing a layer structure of an electric field effect type transistor (TFT) formed by thin film semiconductor layers. The TFT may be used as a part of a control part for forming a photoelectric converter. In FIG. 4, the same constituent parts are denoted by the same reference numeral in FIGS. 1 and 2. In FIG. 4, reference numeral 7 denotes a gate insulation film. Reference numeral 60 denotes an upper electrode. The method for forming the TFT will be explained in due order. On the insulation substrate 1, a lower electrode 2 which serves as a gate electrode, the gate insulation film 7, an i layer 4, an n layer 5, and the upper electrode 60 which serves as a source and drain electrode are formed in this-order. The source and drain electrodes are formed by etching the upper electrode 60. Thereafter, a channel part is constituted by etching the n layer 5. The property of the TFT is very sensitive to the state of the interface between the gate insulation film 7 and the i layer 4. Therefore, the insulation film 7 and the i layer 4 are normally deposited in a continuous manner under the same vacuum in order to prevent contamination.

When an optical sensor having a layer structure shown in FIGS. 1 and 2 is formed on the same substrate as this TFT, the layer structure of the TFT has a problem that may induce cost increases and property deterioration. The reason for this is as follows. With the PIN type optical sensor shown in FIG. 1, the optical sensor is constituted in such a manner that the electrode/the p layer/the i layer/the n layer/and the electrode are formed in this order from the side of the substrate. With the Schottky type optical sensor shown in FIG. 2, the electrode/the i layer/the n layer/and the electrode are formed in this order from the side of the substrate. On the other hand, with the TFT, the electrode/ the insulation film/the i layer/the n layer/and the electrode are formed in this order from the side of the substrate. Thus, the conventional optical sensors and the TFT are different in their constitution. This means that the each films cannot be formed in the same process. In other words, yield is lowered and cost increases because of the complicated nature of the process. In order to form the i layer/n layer at the same time with a common process, a process for etching the gate insulation layer 7 and the p layer 3 is needed. This means a possibility that the p layer 3 and the i layer 4, which constitute an injection blocking layer, one of the important layers of the aforementioned optical sensor, cannot be formed in a continuous manner under the same vacuum, and the interface between the gate insulation film 7 and the i layer 4, which are important for the TFT, will possibly be contaminated by the etching for the patterning of the gate insulation film, as well as a factor for property deterioration or a decrease in the SN ratio.

Furthermore, in order to improve the property of the Schottky type sensor shown in FIG. 2, the order of the film structure may be made the same in the case of forming an oxide film or a nitride film between the lower electrode 2 and the i layer 4. However, as described before, it is required that the thickness of the oxide film and the nitride film be set at about 100 angstroms. The oxide film or the nitride film cannot be substantially used in common with the gate insulation film 7. FIG. 5 is a graph showing one example of our experiment results on the gate insulation film 7 and yield of the TFT. When the thickness of the gate insulation film is 1000 angstroms or less, the yield abruptly lowers. When the thickness is 800 angstroms, the yield is about 30%. When the thickness is 500 angstroms, the yield is 0%. When the thickness is 250 angstroms, even the operation of the TFT cannot be confirmed. In this way, it is normally difficult to commonly use the oxide film or the nitride film of an optical sensor using the tunnel effect and the gate insulation film of a TFT in which electrons and holes must be insulated.

Furthermore, it is difficult to prepare a capacity element (hereinafter referred to as a "capacitor") having favorable properties with a small amount of leakage in the same structure as the optical sensor. The capacity element constitutes an element needed for obtaining an integral amount of electric charge and current (not shown). The capacitor is intended to accumulate electric charge between the two electrodes, so that a layer for blocking movement of electrons and holes needed in an intermediate layer between the electrodes. On the other hand, with a conventional optical sensor, it is difficult to obtain an intermediate layer with favorable properties such as heat stability and low leakage because only a semiconductor layer or a layer in which either electrons or holes move is provided between the electrodes.

In this way, the matching is not favorable in either process or properties for the TFT and capacitor that are important elements constituting a photoelectric converter. Thus the processes become numerous and complicated for forming an entire system that a plurality of optical sensors are arranged one-dimensionally or two-dimensionally and successively detects light signals, so that it is not easy to raise yield. There is yet room for improvement in preparation of a high performance device with many functions at low cost.

SUMMARY OF THE INVENTION

An object of the present invention is to provide a photoelectric converter having a high SN ratio and stable properties, a driving method thereof and a system having the photoelectric converter.

Specifically, an object of the present invention is to provide a photoelectric converter that can be set to a high S/N ratio state where the converter can be instantly used at the time of the start of actual usage by giving a weak electric field to the photoelectric conversion element even in the state where the photoelectric converter is not actually used, resulting in providing a photoelectric conversion element that is excellent in usage and high in quality. That is, a photoelectric converter constantly having a high S/N ratio and stable properties can be obtained.

Furthermore, an object of the present invention is to provide a photoelectric converter that is high in yield and stable in properties, and a system having the photoelectric converter.

In addition, an object of the present invention is to provide a photoelectric converter that can be formed in the same process as a TFT, and that can be prepared at a low cost without causing complication of the production process, and to provide a driving method for the photoelectric converter and a system having the photoelectric converter.

The present invention has been made to solve the aforementioned problem. An object of the present invention is to provide a photoelectric converter comprising a photoelectric conversion element of a laminated structure comprising:

a first electrode layer;

an insulation layer for blocking the passage of a first carrier and a second carrier having a different polarity from the first carrier;

a photoelectric conversion semiconductor layer;

an injection blocking layer for blocking the injection of the first carrier to the photoelectric semiconductor layer; and a second electrode layer;

wherein a switching means is provided for operating the converter by switching the following three operation modes a) through c) for applying an electric field to each layer of the photoelectric conversion element:

a) an idling mode for emitting the second carrier from the photoelectric conversion element;

b) a refreshment mode for refreshing the first carrier accumulated in the photoelectric conversion element; and c) a photoelectric conversion mode for generating pairs of the first carrier and the second carrier in accordance with an amount of incident light to accumulate the first carrier.

An object of the present invention is to provide a method for driving a photoelectric converter comprising a photoelectric conversion element of a laminated structure comprising a first electrode layer, an insulation layer for blocking the passage of a first carrier and a second carrier having a different polarity from the first carrier, a photoelectric conversion semiconductor layer, an injection blocking layer for blocking the injection of the first carrier into the photoelectric semiconductor layer, and a second electrode layer, the method comprising the following three operation modes a) through c) for applying an electrode field to each layer of the photoelectric conversion element:

a) an idling mode for emitting the second carrier from the photoelectric conversion element;

b) a refreshment mode for refreshing the first carrier accumulated in the photoelectric conversion element; and c) a photoelectric conversion mode for generating pairs of the first carrier and the second carrier in accordance with an amount of incident light to accumulate the first carrier.

Furthermore, an object of the present invention is to provide a system comprising:

the photoelectric converter, the photoelectric converter having a phosphor for converting input radiation into light;

a signal processing means for processing a signal from the photoelectric converter;

a recording means for recording a signal from the signal processing means;

a display means for displaying the signal from the signal processing means;

an electric transmission means for electrically transmitting a signal from the signal processing means; and a radiation source for generating radiation.

BRIEF DESCRIPTION OF THE DRAWINGS

FIG. 7B, FIG. 7C, FIG. 12A, FIG. 126, FIG. 12C, FIG. 13A, FIG. 13B, FIG. 13C, FIG. 16A, FIG. 16B, FIG. 16C, FIG. 18A, FIG. 18B, and FIG. 18C are schematic band views showing one example of a band state of energy of the photoelectric conversion element.

DETAILED DESCRIPTION OF THE PREFERRED EMBODIMENTS

Figure 1:
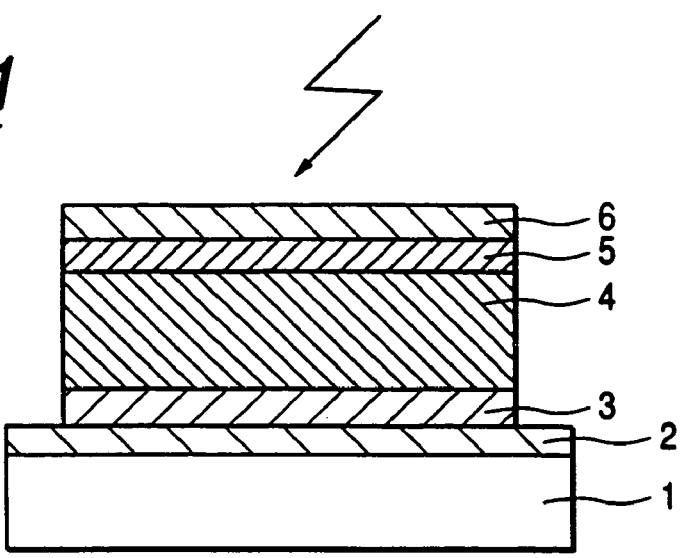
FIG. 1, FIG. 2, FIG. 6A, FIG. 17A are schematic sectional views for explaining one structural example of a photoelectric conversion element.

Embodiments of the present invention will be explained in detail hereinbelow by referring to the drawings.

At first, to facilitate understanding the present invention, a photoelectric converter having no idling mode will be explained.

Figure 6A:
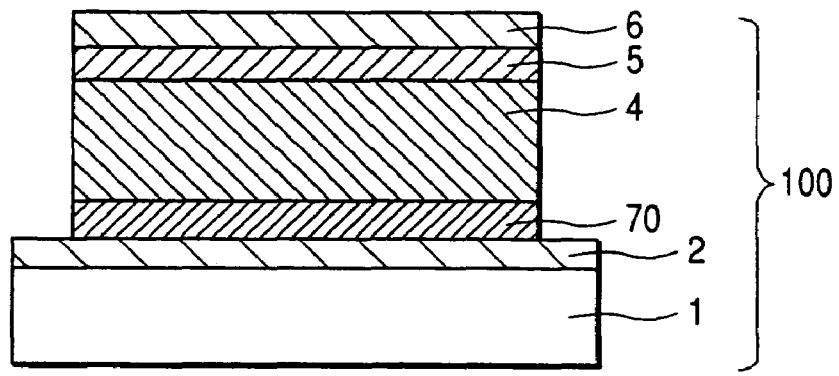
Figure 6B:
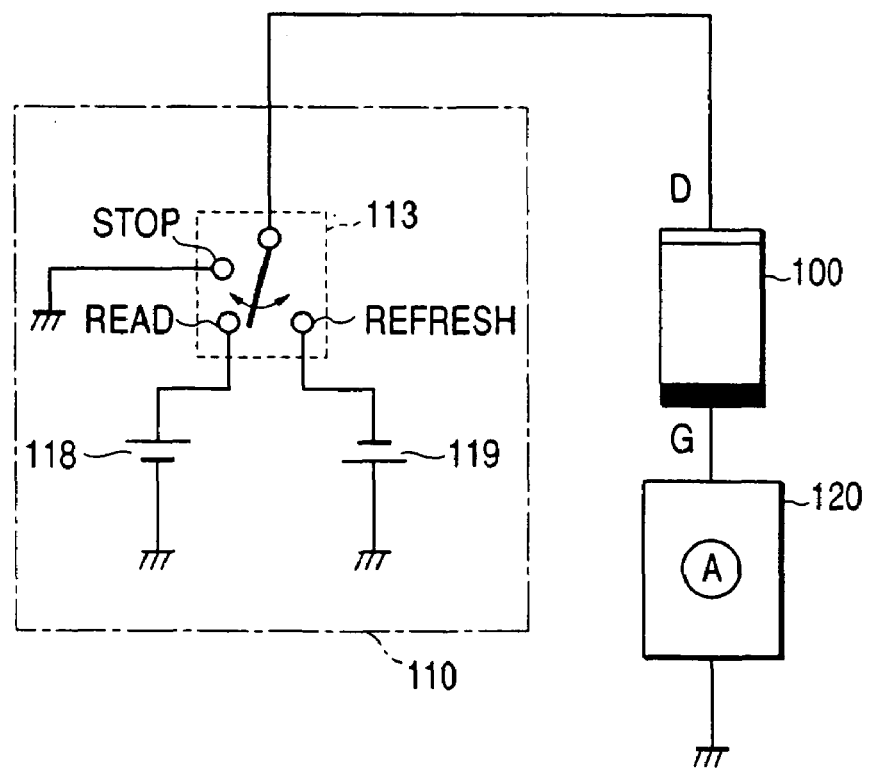

FIGS. 6A and 6B are a schematic layer structure view for explaining the photoelectric conversion element of the photoelectric converter and a schematic circuit view of the photoelectric converter, respectively.

In FIG. 6A, reference numeral 1 denotes a substrate formed of glass or the like that has at least an insulation surface. Reference numeral 2 denotes a lower electrode which is formed of Al, Cr or the like. Reference numeral 70 denotes an insulation layer formed of silicon nitride (SiN), which blocks the passage of both electrons and holes. The thickness thereof is set to 500 angstroms or more, which blocks the passage of electrons and holes by a tunnel effect. Reference numeral 4 denotes a photoelectric conversion semiconductor layer formed of an intrinsic semiconductor i layer of hydrogenated amorphous silicon (a-Si:H). Reference numeral 5 denotes an injection blocking layer formed of an $n^+$ layer of a-Si to block the injection of holes from the side of a transparent electrode 6 to the photoelectric conversion semiconductor layer 4. The transparent electrode 6 is formed of an oxide or a compound containing indium or tin such as ITO.

In FIG. 6B, reference numeral 100 denotes a symbolized photoelectric conversion element shown in FIG. 6A. Symbol D denotes the side of the transparent electrode 6 while symbol G denotes an electrode on the side of the lower electrode 2. Reference numeral 120 denotes a detecting element for a detecting current that flows to the photoelectric conversion element 100. Reference numeral 110 denotes a power source portion. The power source portion 110 comprises a positive power source 118 for applying a positive potential to a D electrode, a negative power source 119 for applying a negative potential, a GND terminal for applying a GND potential,.and a switch 113 for switching the positive power source, the negative power source and the GND terminal. The switch 113 is controlled in such a manner that the switch 113 is connected to the negative power source 119 on the refresh side in the refreshment mode, the switch is connected to the positive power source 118 on the read side in the photoelectric conversion mode, and the switch is connected to the GND terminal on the stop side in the recess mode of the photoelectric conversion element.

The recess mode of the photoelectric conversion element refers to the setting of a recess state in which the photoelectric conversion element is not operated by changing the applied bias to the photoelectric conversion element to the GND potential. It is operated so that the absolute value of a flat band voltage ($V_{FB}$) becomes smaller by setting both ends of the photoelectric conversion element to the same potential (GND). Incidentally, it is possible to operate the photoelectric converter without the recess mode. However, by providing a recess mode of the photoelectric converter, $V_{FB}$, which has been moved during operation of the photoelectric conversion element, can be brought back to its original state. As a consequence, the photoelectric conversion element can be used in a stable state at all times, thereby making it possible to improve the performance of the photoelectric converter. In addition, in the case where a plurality of photoelectric conversion elements are used, it becomes possible to minimize the scattering of $V_{FB}$ of the plurality of photoelectric conversion elements, resulting in that the performance of the photoelectric converter can be further improved.

Figure 7A:
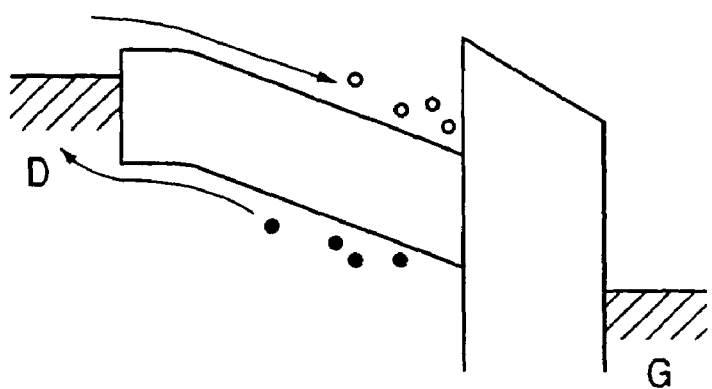
FIG. 7A,.
Figure 7B:
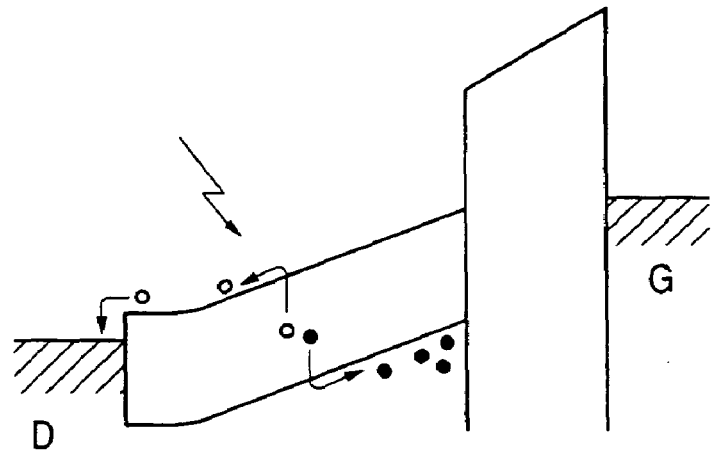

Here, an operation of the photoelectric conversion element 100 will be explained. FIGS. 7A and 7B are energy band views of the photoelectric conversion part showing an operation of the refreshment mode and the photoelectric conversion mode of the photoelectric conversion element 100; the view shows the state in the thickness direction of each layer of the photoelectric conversion element.

In the refreshment mode of FIG. 7A, since a negative potential is applied to the D electrode with respective to the G electrode, holes shown by black solid circles in the i layer 4 are led to the D electrode by the electric field. At the same time, electrons shown by white circles are injected into the i layer 4. At this time, part of the holes and electrons are recombined in the n layer 5 and the i layer 4 and disappear. When this state continues for a sufficiently long time, the holes in the i layer 4 will be emitted from the i layer 4 (FIG. 7A).

When the mode is set to the photoelectric conversion mode of FIG. 7B, at this state, a positive potential is applied to the D electrode with respect to the D electrode, so that the electrons in the i layer 4 are instantly led to the D electrode. However, since the n layer 5 serves as an injection blocking layer, the holes are not led to the i layer 4. When light is entered into the i layer 4 at this state, the light is absorbed, and pairs of electron and hole are generated. These electrons are led to the D electrode by the electric field and the holes move into the i layer 4 and reach the interface of the insulation layer 70. However, since the holes cannot move into the insulation layer 70, the holes are detained in the i layer 4. At this time, since the electrons move to the D electrode and the holes move to the interface between the insulation layer 70 and the i layer 4, an electrically neutral state in the elements can be maintained so that current flows from the G electrode to the detecting element 120. Since this current corresponds to the pairs of electron and hole generated by the light, the current is proportional to the incident light (FIG. 7B).

When the mode is set to the refreshment mode again after the photoelectric conversion mode is maintained for a certain period, the holes detained in the i layer 4 are led to the D electrode as described above. At the same time, the electric charge corresponding to these holes flows to the detecting element 120. The amount of holes corresponds to the total amount of light entered during the photoelectric conversion mode period, and the electric charge flowing into the detecting element 120 corresponds to the total amount of light. At this time, electric charge corresponding to the amount of electrons injected into the i layer 4 flows, but since the amount is approximately constant, this amount can be subtracted to detect the electric charge.

Figure 7C:
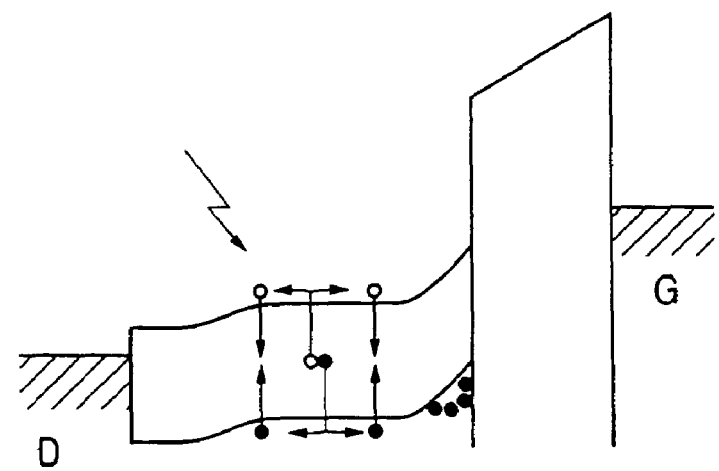

In other words, the photoelectric conversion part 100 outputs not only an amount of light entered real-time but also the total amount of light entered at a certain period. It can be said that this is a major characteristic of the photoelectric conversion element having the present example structure. The detecting element 120 may detect either or both of the electron flow and hole flow, depending on the purpose thereof. In addition, FIG. 7C is a state view showing the result of the lapse in time from the state of FIG. 7B in the case where the illuminance of the incident light is strong, as will be described later.

Here, one example of operation of the photoelectric converter will be described by referring to FIG. 8.

Figure 8:
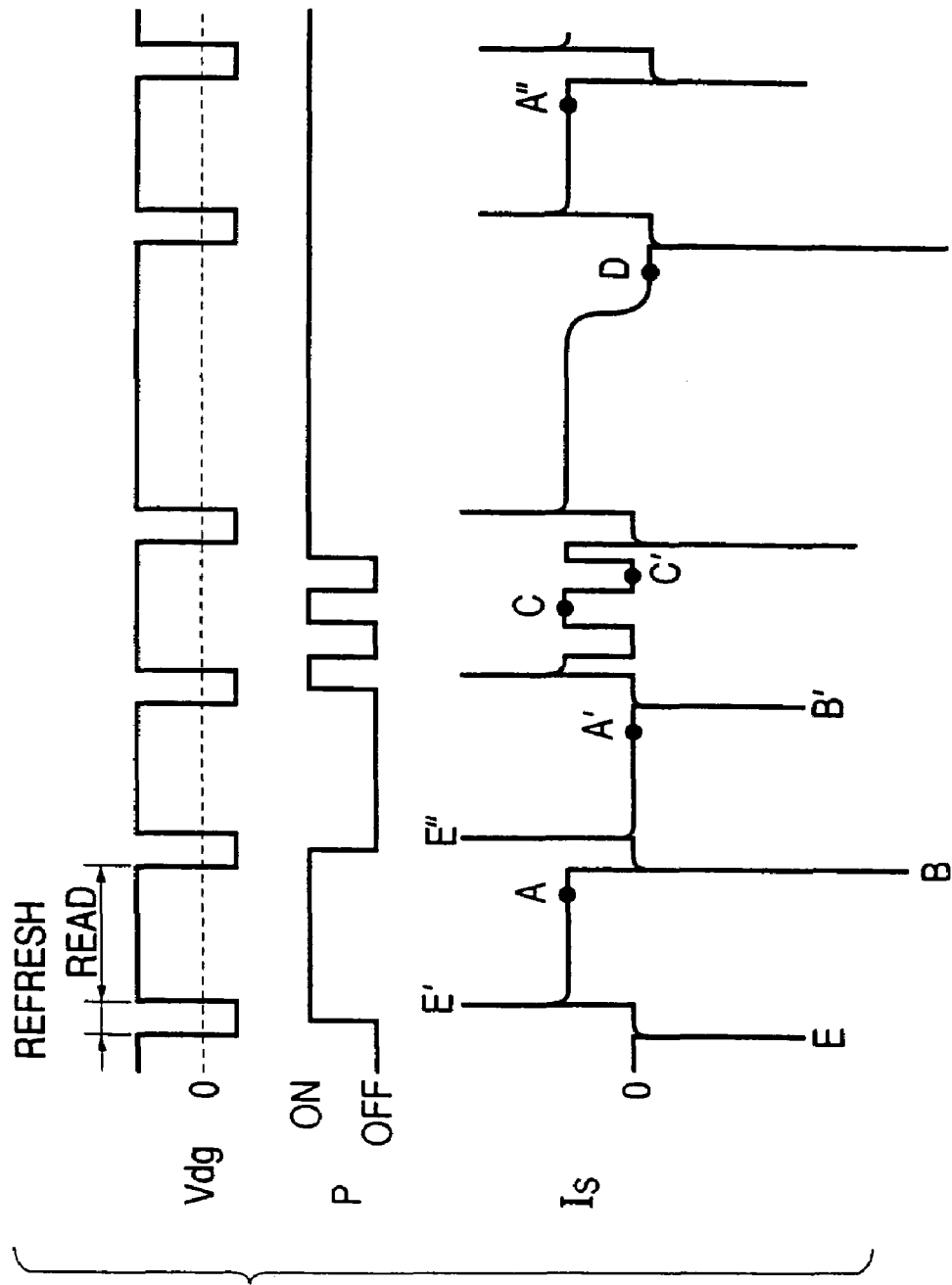
FIG. 8, FIG. 11, FIG. 15, FIG. 22, and FIG. 23 are schematic timing charts associated with an operation of the photoelectric conversion element.

FIG. 8 is an example of a timing chart of an operation in the photoelectric converter shown in FIGS. 6A and 6B. Symbol $V_{dg}$ in FIG. 8 shows the potential of the D electrode with respect to the G electrode of the photoelectric conversion part 100. Symbol P shows the state of the incident light. Symbol ON shows the state where light is entered, while symbol OFF shows the state where light is not entered, namely, the dark state is shown. Symbol Is shows the current that flows into the detecting element 120 while the abscissa direction shows the lapse of time.

In the beginning, when the switch 113 is connected in the refresh direction, the mode is set to the refreshment mode and $V_{dg}$ becomes a negative potential, and holes are emitted as shown in FIG. 7A. Furthermore, along with the injection of electrons into the i layer 4, a negative rush current E shown by symbol E in FIG. 8 flows into the detecting element 120. After that, when the refreshment mode is terminated and the switch 113 is connected in the read direction, the electrons in the i layer 4 are emitted, and the positive rush current E' flows and the photoelectric conversion mode is set. When light is entered at this time, the photoelectric current shown by symbol A flows. When the dark state is set in a similar operation, the current does not flow as shown by symbol A'. Consequently, the incident light can be detected when the photoelectric current A is directly integrated, or the photoelectric current A is integrated for a certain period.

When the switch 113 is connected in the refresh direction from the state A, the rush current B flows. This is of an amount which reflects the total amount of incident light in the photoelectric conversion mode period immediately before the flow of the rush current B, so that this rush current B may be integrated or a value corresponding to the integration of the rush current B may be obtained. When light is not entered in the photoelectric conversion mode immediately before it, the rush current B becomes small as shown by symbol B'. When the difference is detected, entrance of light can be detected. Furthermore, since the aforementioned rush current E' and rush current E" are almost equal to the rush current B', the difference may be subtracted from the rush current B.

Furthermore, when the state of incident light is changed even during the same photoelectric conversion mode period, the Is changes as shown by symbols C and C'. By detecting this, the entrance state of light can be also detected. In other words, it is shown that the refreshment mode is not necessarily set at each time of the detection.

However, in the case where the photoelectric conversion mode period is prolonged for some reason, or the illuminance of the incident light is strong, the current does not flow despite of entrance of light as shown by symbol D. As shown in FIG. 7C, this is because a large number of holes are detained in the i layer 4, the electric field in the i layer 4 becomes smaller because of these holes, and the generated electrons are not led to the D electrode to be recombined with the holes in the i layer 4. When the light entrance is changed at this state, the current may flow unstably. When the refreshment mode is set again, the holes in the i layer 4 are emitted again so that a current equal to A is obtained as shown by symbol A" in the subsequent photoelectric conversion mode.

In the aforementioned explanation, the incident light is set at a constant level. It goes without saying that currents A, B, and C continuously change depending on the strength of the incident light, and the strength of the current can be quantitatively detected irrespective of the presence of incident light.

In the aforementioned explanation, in the case where the holes in the i layer 4 are emitted in the refreshment mode, it is ideal that all the holes are emitted. However, an advantage can be obtained even by emitting a part of the holes. In doing so, the value is the same when all the holes are emitted at the photoelectric current A or C so that there is no problem. Furthermore, when the holes may be emitted in such a manner that a definite amount constantly remains, the light amount can be quantitatively detected by the current B. In other words, the current value may not be set to the D state, namely the state of FIG. 7C, at the time of the detection of the subsequent photoelectric conversion mode. The $V_{dg}$ voltage of the refreshment mode, the period of the refreshment mode, and the characteristic of the injection blocking layer of the n layer 5 may be determined.

Furthermore, in the refreshment mode, the injection of electrons into the i layer 4 is not a required condition, and the $V_{dg}$ voltage is not limited to a negative voltage. Part of the holes may be emitted from the i layer 4. This is because when a large number of holes are detained in the i layer 4, the electric field in the i layer 4 is applied in a direction in which the holes are led to the D electrode even when $V_{dg}$ is a positive voltage. Similarly, the characteristic of the injection blocking layer of the n layer 5 is not a required condition because the electrons can be injected into the i layer 4.

FIGS. 9A, 9B, 9C and 9D illustrate a structural example of the detecting element, respectively. Reference numeral 121 denotes an ammeter represented by current Amp. Reference numeral 122 denotes a voltmeter. Reference numeral 123 denotes a resistor. Reference numeral 124 denotes a capacitor. Reference numeral 125 denotes a switching element, and reference numeral 126 denotes an operation amplifier.

Figure 9A:
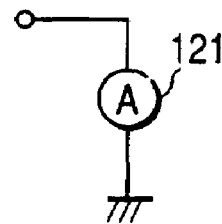
FIG. 9A, FIG. 9B, FIG. 9C and FIG. 9D are schematic circuit diagrams showing one preferred example of a detecting element.
Figure 9B:
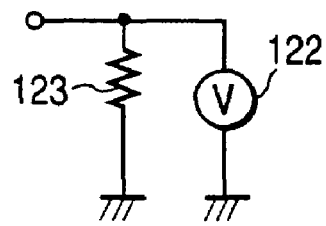
Figure 9C:
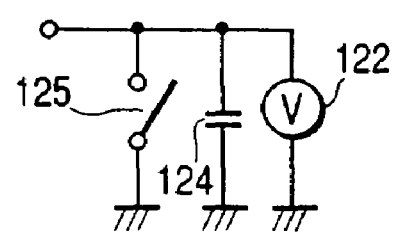
Figure 9D:
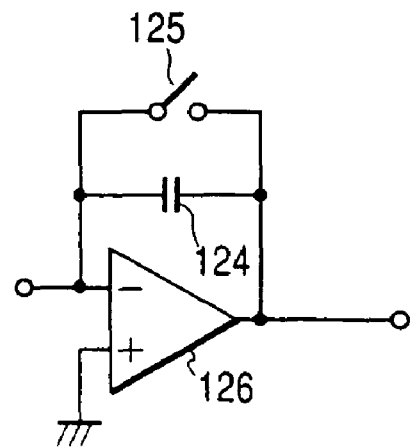

FIG. 9A shows the direct detection of the current. The output of the ammeter 121 is a voltage or an amplified current. FIG. 9B shows the-detection of a voltage by a voltmeter 122 by allowing the current to flow through the resistor 123. FIG. 9C shows the detection of a voltage by the voltmeter 122 by accumulating an electric charge in the capacitor 124. FIG. 9D shows the detection of an integrated value of current as a voltage by an operational amplifier 126. In FIGS. 9C and 9D, the switching element 125 serves to give an initial value to each cycle of detection. A high resistance resistor can be replaced depending on the method of detection.

The ammeter and voltmeter can be constituted with a transistor or an operational amplifier combined with the transistor, a resistor and a capacitor. The element that can be operated at a high speed may be used. The detecting element is not limited to the aforementioned four types. Either current or electric charge is directly detected, or an integrated value thereof may be detected. A detector which detects a current or voltage value, a resistor, a capacitor and a switching element are combined, and can be constituted such that a plurality of photoelectric conversion parts are output at the same time or successively.

In the case where a line sensor or an area sensor are constituted, the wiring of the power source and the switching element are combined, and a potential of 1000 or more photoelectric conversion parts in matrix is controlled or detected to output as an electric signal. In this case, the switching element, the capacitor, and part of the resistors are constituted on the same substrate as the photoelectric conversion part, it is favorable in terms of SN ratio and cost. In this case, the photoelectric conversion part has the same film structure as the TFT, which is a typical switching element. Thus, the photoelectric conversion part can be formed in the same process at the same time, with the result that a photoelectric converter with low cost and a high SN ratio can be realized.

Next, a difference in the characteristic of the photoelectric converter with the refresh voltage value in the refreshment mode will be explained.

Figure 10:
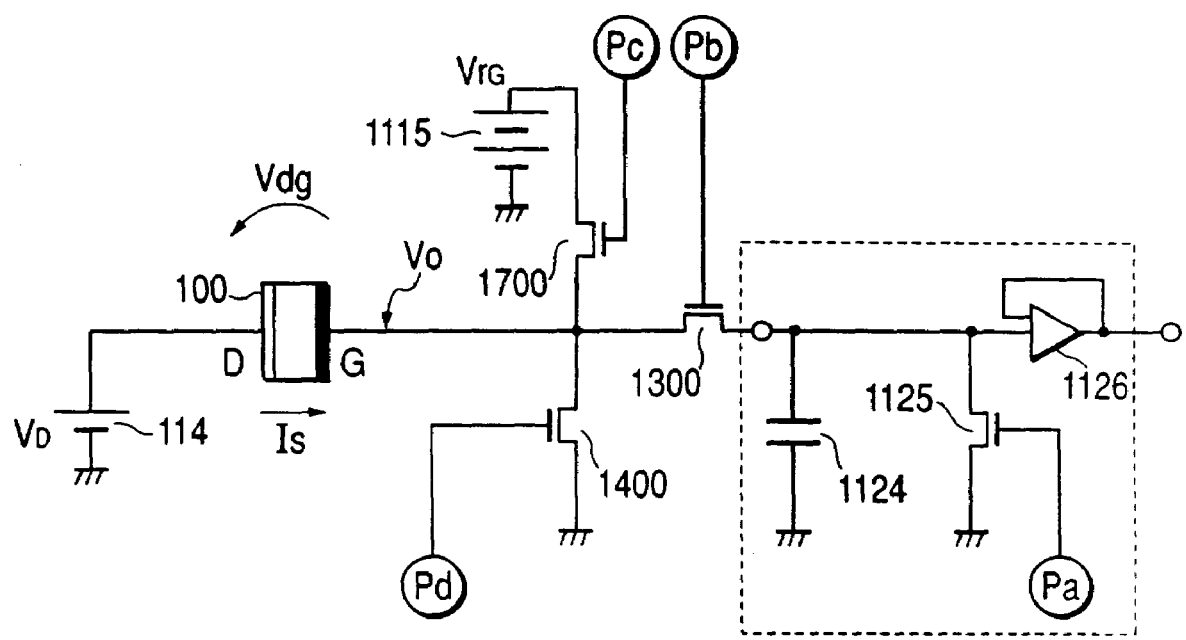
FIG. 10, FIG. 14, and FIG. 20 are schematic circuit diagrams showing one preferred example of the photoelectric converter.
Figure 11:
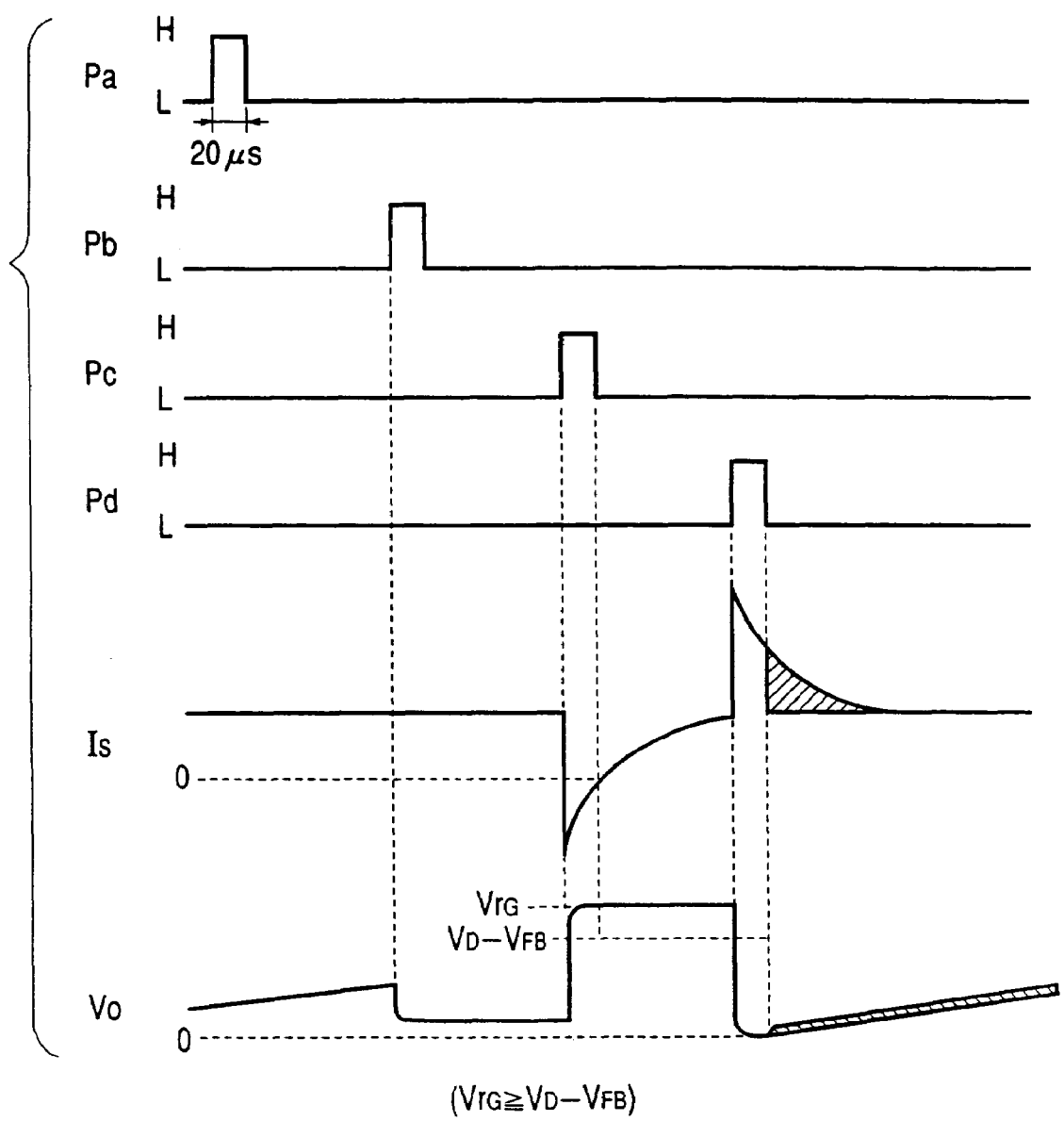

FIG. 10 shows a one-bit equivalent circuit diagram of a photoelectric converter comprised of a TFT 1700 and a power source 1115. FIG. 11 is a timing chart illustrating the operation of the photoelectric converter.

Description will now be given using the one-bit equivalent circuit diagram of the photoelectric converter as shown in FIG. 10, which is for refreshment in which a positive voltage is applied through the TFT 1700 to the G electrode of the photoelectric conversion element 100. The potential of the D electrode of the photoelectric conversion element 100 is designed to be $V_D$ due to the power source 114 and the potential of the G electrode during refresh operation is designed to be $V_{rG}$ due to the power source 114.

In the beginning, there will be explained a case in which the potential ($V_O$) of the G electrode of the photoelectric conversion element 100 shown in FIG. 6A is refreshed to a potential greater than the potential ($V_D$) of the D electrode ($V_O=V_{rG} \geq V_D$) When refreshed to such a state, the holes detained in the i layer 4 of the photoelectric conversion element 100 and all the holes which are trapped in the interface defect which is present in the interface between the i layer 4 and the insulation layer 70 are completely emitted into the D electrode. On the contrary, at this time, electrons flow into the i layer 4 from the D electrode so that part thereof is trapped in the interface defect which is present in the interface between the i layer 4 and the insulation layer 70. Hereinafter, the current is referred to as a negative rush current. Then after the termination of the refresh operation, when the potential of the G electrode of the photoelectric conversion element 100 is initialized to the GND potential or the like, all the electrons trapped in the i layer 4 and in the interface defect are emitted to the D electrode. Hereinafter, this current is referred to as a positive rush current. For the interface defect which is present in the interface between the i layer 4 and the insulation layer 70, the energy level is generally deep, so that the energy that moves electrons and holes present in the position of the interface defect, and the energy that moves electrons and holes from other positions to the positions of the interface defect are relatively high so that the ostensible mobility becomes lower. As a consequence, it takes more than several tens of micro-seconds to several seconds until the positive rush current becomes zero, namely all the electrons trapped in the interface defect are emitted into the D electrode. Even when the G electrode reset operation is terminated, a large rush current flows. As a result, the electric charge accumulated in the capacity which is owned by the G electrode includes electric charge generated by the rush current which is a noise component, whereby the SN ratio is lowered depending on the electric charge.

The aforementioned reason will be explained in detail by further using FIG. 10 and FIG. 11. Symbols Pa, Pb, Pc and Pd in FIG. 11 denote timings of pulses for driving a switching element 1125, TFT 1300 for transmission, TFT 1700 for refreshment, and a TFT 1400 for reset in FIG. 10, respectively. Here, reference numeral H denotes the high level when each of the driving elements is turned on. Generally, with the crystal silicon semiconductor switching element, +5V to +12V is used while with a-Si TFT, +8V through +15V is used. Furthermore, with L, 0V is generally used. As shown by an arrow in FIG. 10, symbols Is and $V_O$ denote current which flows in the direction of the arrow and the potential of the G electrode in the state in which a definite signal light is irradiated to each of the photoelectric conversion elements 100. Here, the pulse widths of Pa through Pd and Is and $V_O$ at the operation of 20 $\mu$s are shown in FIG. 11.

In FIG. 11, the potential $V_O$ of the G electrode of the photoelectric conversion element 100 is kept at a definite high potential from the rise of the pulse for refreshment of Pc and to the rise of the pulse for the reset of Pd. As a consequence, a positive rush current is not generated during this period and at the first pulse rise of Pd, a positive rush current is generated which is considered to be generated by the emission of the electrons which are trapped in the interface defect. It takes about 80 to 100 $\mu$ seconds with a device prepared by us until this positive rush current is attenuated and becomes zero. As a consequence, at the time of the drop of the pulse of Pd at the start of accumulating the signal electric charge in the capacity owned by the G electrode, a large amount of positive rush current is generated with the result that the electric charge and the voltage value of a part as shown by a slanted line in FIG. 11 are accumulated as a noise component. As a consequence, the accumulated integral SN ratio is lowered. As a method for reducing the positive rush current, it is considered that the time of the initialization pulse of Pd is prolonged. However, there is a limit in time, and the time for reading the signal of the device as a whole is prolonged, thereby causing the lowering in speed of the device, namely a deterioration in the performance thereof.

Figure 12A:
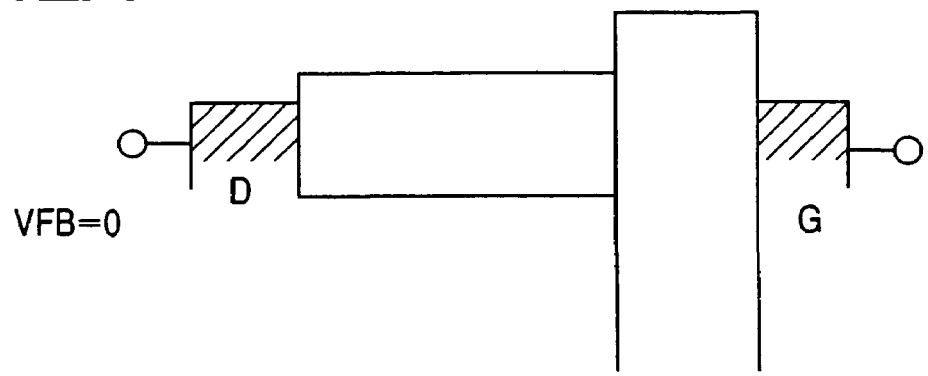
Figure 12B:
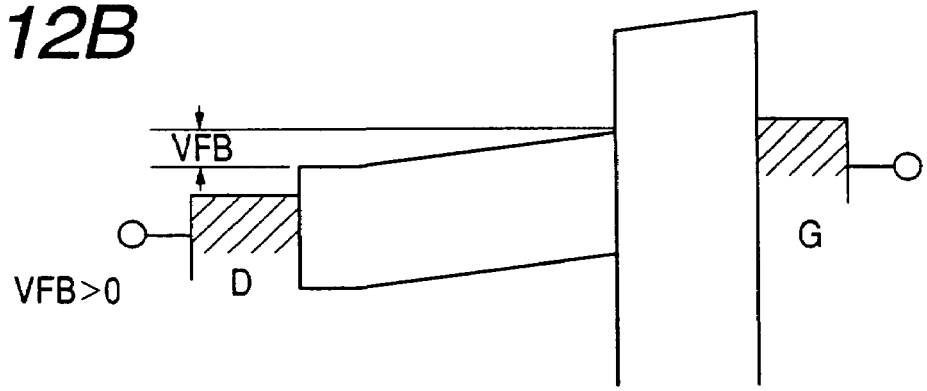
Figure 12C:
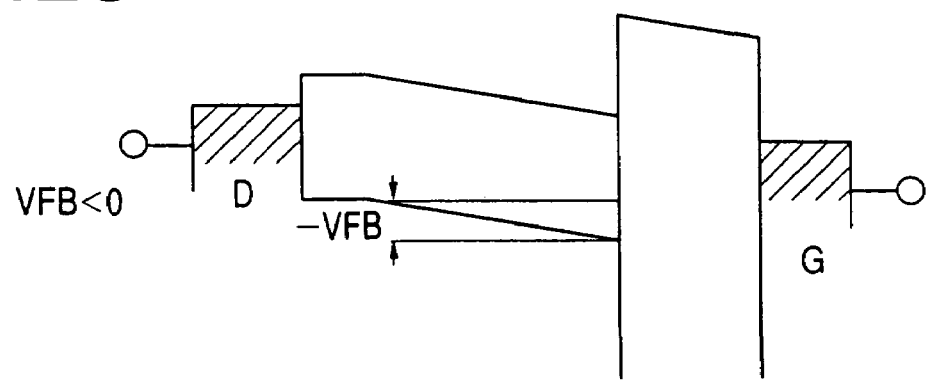

Next, the conditions of the applied voltage at the time of refreshing the photoelectric conversion element 100 will be explained by using FIGS. 12A through 12C. FIGS. 12A through 12C are energy band views of the photoelectric conversion element 100. Each of the electrodes (D and G electrodes) at both ends is kept in an open state. The photoelectric conversion element 100 has a so-called MIS (Metal-Insulator-Semiconductor) structure, with the result that a relatively small overall capacity state (depression state) and a relatively large overall capacity state (accumulation state) are generated depending on the voltage condition applied to both end electrodes.

Both ends of each device in FIGS. 12A through 12C are open. With respect to the energy band view, the case of FIG. 12B is the same as the energy band view in the aforementioned depression state, and the case of FIG. 12C is the same as the energy band view of the accumulation state.

Generally, the MIS type capacitor is set to a state of FIG. 12A immediately after preparation thereof, namely the flat state of the i layer band (flat band voltage $V_{FB}$=0V), or the state of FIG. 12B, namely a somewhat depressed state ($3V \geq V_{FB} > 0V$) in many cases. Furthermore, by applying a voltage to both ends of the MIS capacitor, $V_{FB}$ can be set to an arbitrary positive or negative voltage value to some extent.

In the case where the one bit circuit shown in FIG. 6B is driven at the timing shown in FIG. 8, the refreshment time can made shorter than the photoelectric conversion time. In the case where the photoelectric conversion elements are arranged in two dimensions for matrix driving, the ratio of the refreshment time and the photoelectric conversion time becomes larger with an increase in the number of the photoelectric conversion elements.

It is known that generally the flat band voltage $V_{FB}$ of the MIS type capacitor largely depends on electric field, time, and temperature. However, in the photoelectric conversion element in the photoelectric converter of the present invention, the flat band voltage $V_{FB}$ moves in the direction of positive voltage at the time of refreshment while the flat band voltage $V_{FB}$ moves in the direction of negative voltage at the time of the photoelectric conversion.

As a consequence, in the photoelectric conversion element in the photoelectric converter shown in FIG. 6A, the flat band voltage $V_{FB}$ moves in the direction of the negative voltage so that the dynamic range of the photoelectric conversion element is lowered. Consequently, the SN ratio of the photoelectric converter becomes smaller and stable characteristics cannot be obtained.

Here, the conditions of the voltage value for causing the positive rush current (having a long attenuation time and a large current value) will be summarized. In the beginning, when the flat band voltage $V_{FB}$ of the i layer of the photoelectric conversion element 100 is set to zero, the aforementioned positive rush current flows when the potential ($V_{rG}$) of the G electrode at the time of the refreshment is higher than the potential ($V_D$) of the D electrode, namely $V_{rG} > V_D$.

When the flat band voltage $V_{FB}$ of the i layer of the photoelectric conversion element 100 is not set to zero, the aforementioned positive rush current flows when the potential ($V_{rG}$) of the G electrode at the time of refreshment is higher than the voltage value obtained by subtracting the $V_{FB}$ from the potential ($V_D$) of the D electrode, namely $V_{rG} \geq V_D - V_{FB}$.

Figure 13A:
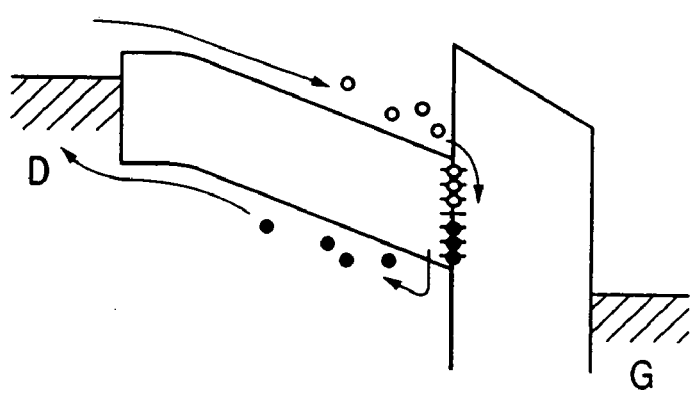
Figure 13B:
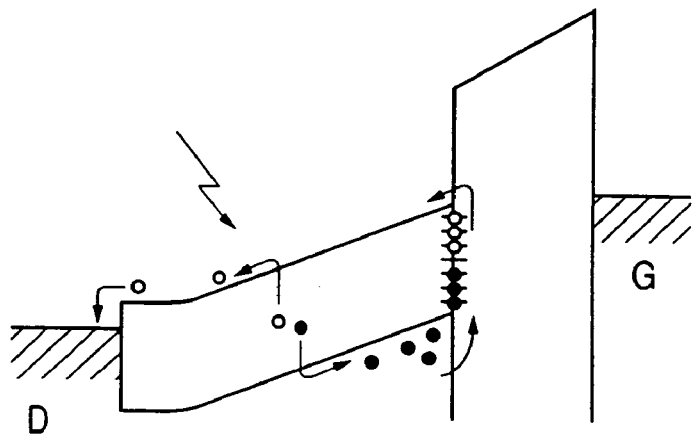
Figure 13C:
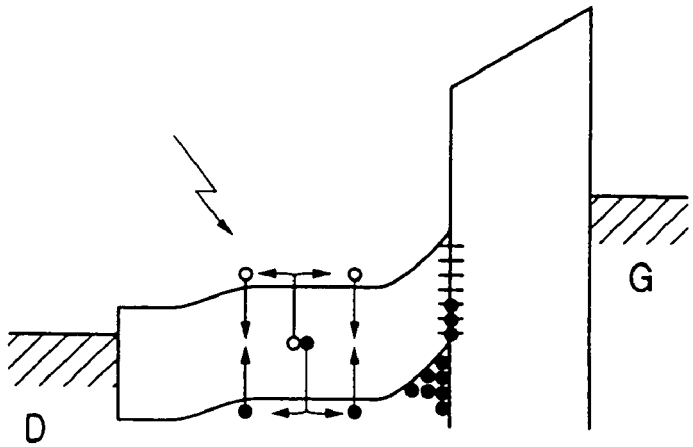

The aforementioned mechanism will be explained by using FIGS. 13A through 13C. FIGS. 13A through 13C are energy band views of the photoelectric conversion element 100 in the case of $V_{rG} \geq V_D - V_{FB}$, the view representing a state in the thickness direction of each layer of the transparent electrode 6 from the lower electrode 2 of FIG. 13A. In FIG. 13A showing the refresh operation, since a negative potential is applied to the D electrode with respective to the G electrode, the holes shown by black solid circles in the i layer 4 are led to the D electrode by the electric field. At the same time, the electrons shown by white circles are injected into the i layer 4. Furthermore, the holes trapped in the interface defect in the interface between the i layer 4 and the insulation layer 70 are led to the D electrode spending a considerable time. Part of the electrons which are injected into the i layer 4 are trapped in the interface defect in the interface between the i layer 4 and the insulation layer 70 spending a considerable of time. At this time, part of the holes and electrons are recombined in the n layer 5 and in the i layer 4 and disappear. When this state continues for a sufficiently long time, the holes in the i layer 4 are emitted from the i layer 4. When the state shown in FIG. 13B of the photoelectric conversion operation is generated, a positive potential is applied to the D electrode with respect to the G electrode so that electrons in the i layer 4 are instantly led to the D electrode. Then the electrons trapped in the interface defect in the interface between the i layer 4 and the insulation layer 70 are led to the D electrode spending a considerable time. The electrons-trapped in the interface defect cause the aforementioned rush current. Since the n layer 5 serves as an injection blocking layer, these holes are not led into the i layer 4. When light is entered into the i layer 4 in this state, the light is absorbed so that pairs of electron and hole are generated. These electrons are led to the D electrode by the electric field while the holes move in the i layer 4 to reach the interface between the i layer 4 and the insulation layer 70. However, the electrons cannot be moved in the insulation layer 70, so that the electrons are detained in the i layer 4. Then after operation of the photoelectric conversion is maintained for a certain period shown in FIG. 13B, the state is shown in FIG. 13C.

Next, the dynamic range (D·R) of the photoelectric conversion element 100 in thus refreshment condition will be explained. When D·R of the photoelectric conversion element 100 shown in FIG. 10 is represented by the electric charge, a relation of $D \cdot R = V_{rG} \times CS$ is obtained. Here, symbol CS denotes the capacity of the photoelectric conversion element 100. Consequently, the dynamic range (D·R) of the photoelectric conversion element 100 will be larger with an increase in the refresh voltage $V_{rG}$. Thus, since the signal light which is irradiated on the photoelectric conversion element 100 is obtained in a large quantity, a large amount of signal due to the light can be obtained so that the SN ratio becomes larger.

Next, there will be explained a case in which the potential ($V_O$) of the G electrode of the photoelectric conversion element 100 is refreshed ($V_{rG} < V_D - V_{FB}$) to a value lower than the potential ($V_D$) of the D electrode.

Figure 14:
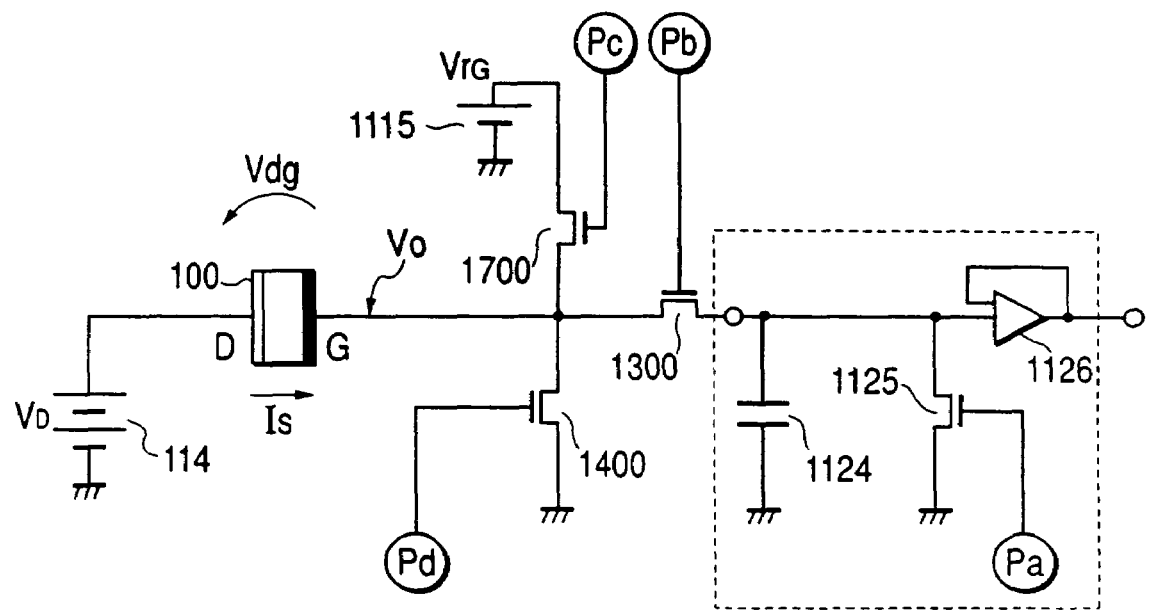

FIG. 14 shows a schematic one-bit equivalent circuit diagram of a photoelectric converter. FIG. 20 is a timing chart in the case of the actual driving of the photoelectric converter shown in FIG. 19.

In FIG. 14, since parts denoted by the same reference numeral as in FIG. 10 are the same, the explanation thereof are omitted. The difference between the schematic equivalent circuit shown in FIG. 10 and the schematic equivalent circuit shown in FIG. 14 is the size of the power source 1115 connected to the TFT 1700. Incidentally, since the photoelectric conversion element 100 has the same structure as the photoelectric conversion element shown in FIG.6A, injection blocking layer between the i layer and the second electrode layer is of the n-type and the carriers that are prevented from injection are the holes. When electric charge of one carrier which is prevented from injection is represented by q, the case will be represented by a relation of q>0.

Incidentally, the signal detecting element shown in FIG. 14 includes detection means in the dotted line of FIG. 14, the TFT 1300 and a means for applying a high level pulse Pb.

In FIG. 14, a point different from FIG. 10 is only that the potential $V_{rG}$ of the power source 1115 for applying a positive potential to the G electrode in the refresh operation of the photoelectric conversion element 100 is set to a level lower than the potential $V_D$ of the power source 114 for applying a positive potential to the D electrode. Specifically, the flat band voltage ($V_{FB}$) which is applied to the G electrode to render flat the energy band of the i layer is present in the photoelectric conversion element 100. The photoelectric conversion element 100 is driven in the state of $V_{rG} \geq V_D - V_{FB}$ in the example of FIG. 10, while the photoelectric conversion element is driven in the state of $V_{rG} < V_D - V_{FB}$ in FIG. 14.

Figure 15:
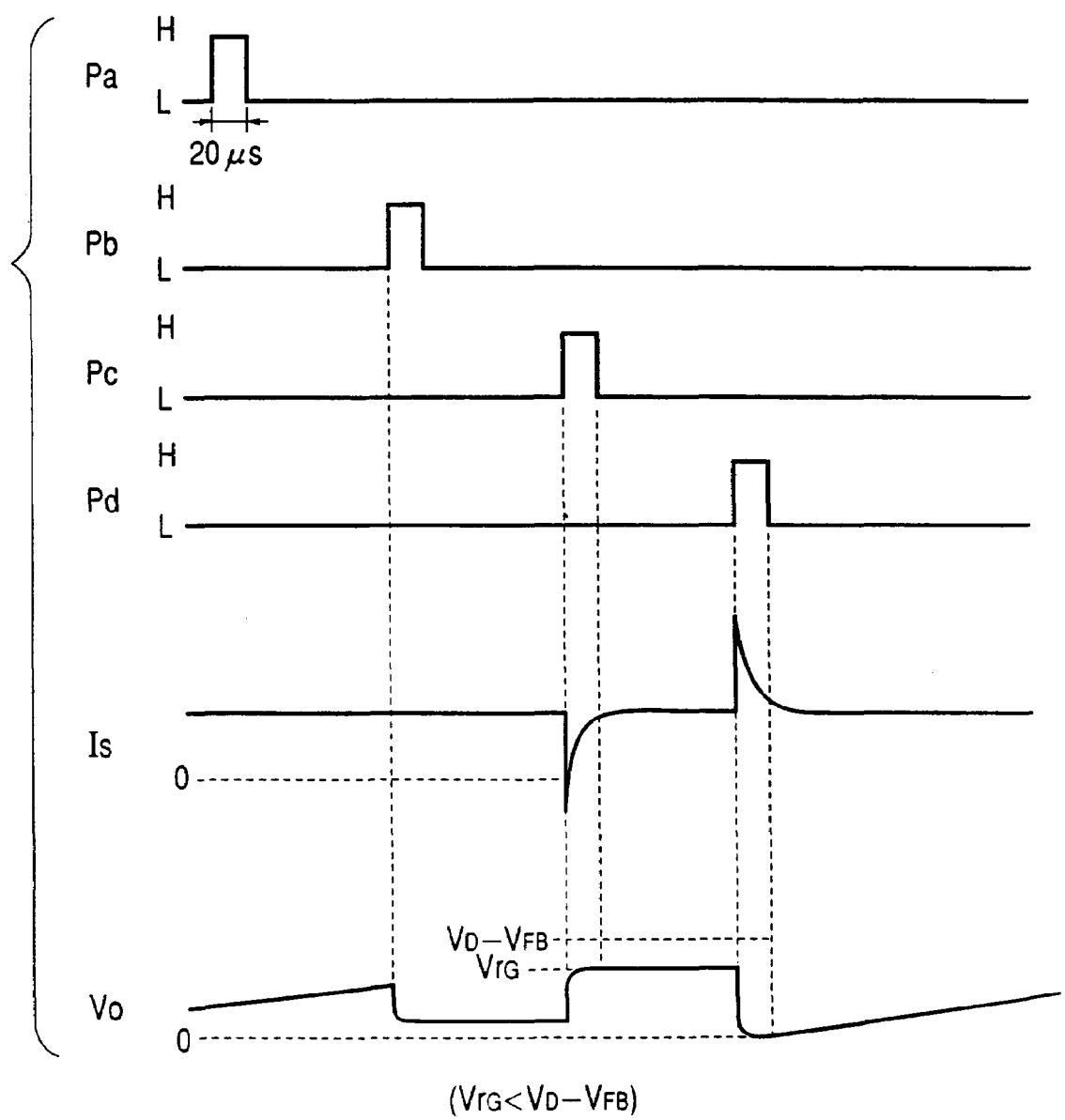

Next, in FIG. 15, there will be explained a case in which the photoelectric converter is operated in the state of $V_{rG} < V_D - V_{FB}$. In FIG. 15, the point different from FIG. 11 is the behavior of the potential $V_O$ of the G electrode caused by the photoelectric conversion element 100 and the current Is.

In FIG. 15, when the refresh pulse of Pc rises and the voltage $V_{rG}(V_{rG} < V_D - V_{FB})$ is applied to the G electrode of the photoelectric conversion element 100, part of the holes detained in the i layer of the photoelectric conversion element 100 are emitted to the D electrode. At this time, it is considered that almost all the holes trapped in the interface defect in the interface between the i layer and the insulation layer remain as it is. Furthermore, at this time, the electrons flow from the D electrode into the i layer in an amount equal to or less than amount corresponding to the part of the holes emitted to the D electrode. However, it is considered that since the electric field in the i layer is low at the potential on the side of the G electrode, the electrons trapped in the interface defect in the interface between the i layer and the insulation layer are almost zero. Consequently, only a small negative rush current is generated in the Is in FIG. 15 at the time of the rise of the refresh pulse of Pc, and the attenuation time becomes shorter. The voltage $V_O$ of the G electrode from the refresh pulse rising of Pc to the G electrode reset pulse rising of $P_d$ is substantially equal to $V_{rG}$, which is below $V_D - V_{FB}$ as shown in FIG. 15.

When the G electrode reset pulse rises and the G electrode of the photoelectric conversion element 100 is connected to GND, all the some electrons detained within the i layer will flow into the electrode D. At this time, the electrons supposedly instantaneously flow out in a small amount, since there are no electrons in the interface defect between the i layer and the insulation layer. Also, it is considered that the holes present in the interface defect hardly move. Therefore, at the time of the G electrode reset pulse rising of Pd, Is will provide only a small positive rush current and a shortened attenuation time. Furthermore, the photoelectric conversion element 100 is operated for about 20 micro seconds from the rise of the G electrode reset pulse of Pd to the fall thereof. At the time of the fall of the Pd pulse which is the time of the start of the photoelectric conversion operation as shown in the figure, the rush current becomes almost zero. Consequently, almost all the electric charge that starts to be accumulated from the fall of the pulse of Pd becomes electric charge caused by the signal light entered to the inside of the photoelectric conversion element 100, with the result that it becomes possible to obtain information with a high SN ratio by reading the signal voltage.

A basic mechanism in the aforementioned structure example will be further explained by using the drawings.

Figure 16A:
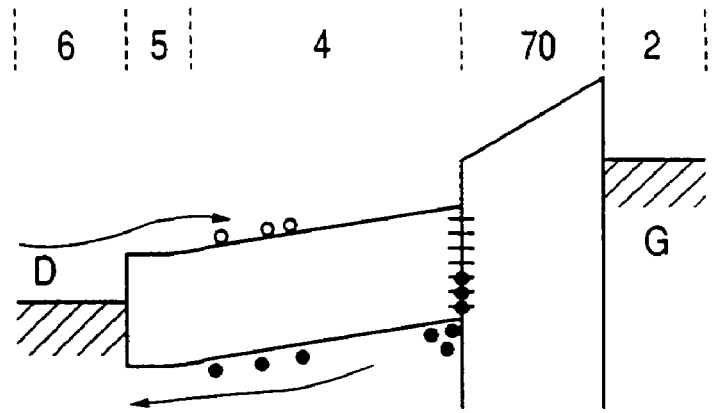
Figure 16B:
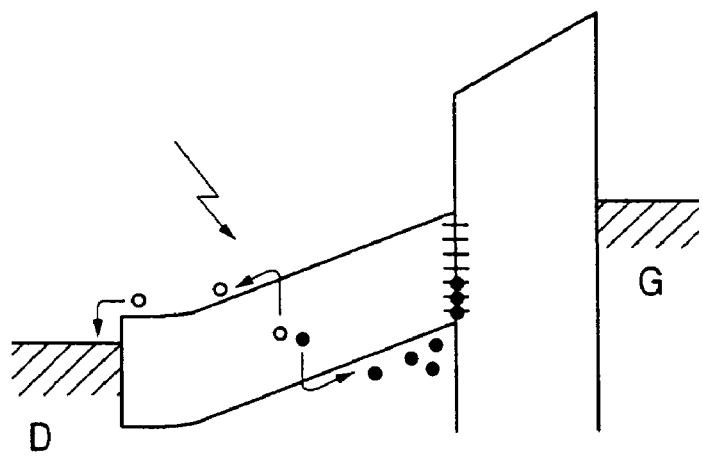
Figure 16C:
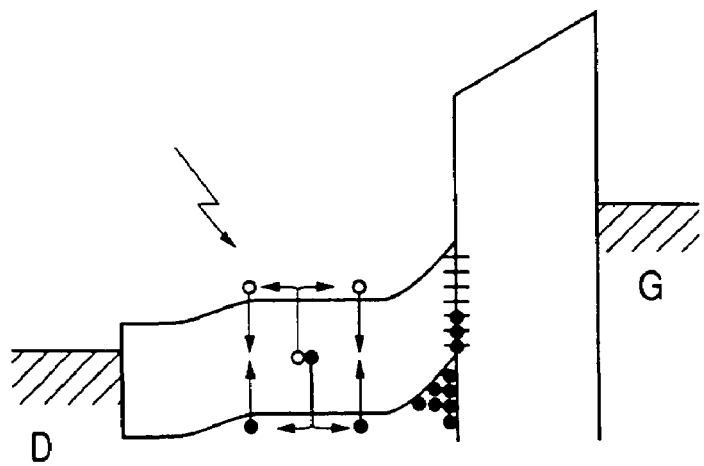

FIGS. 16A through 16C are energy band views showing an operation of the photoelectric conversion element 100 in the case of $V_{rG} < V_D - V_{FB}$. The energy band views correspond to the energy band views shown in FIG. 13A through 13C.

In FIG. 16A of the refresh operation, since a positive potential is given to the G electrode with respect to the D electrode, part of the holes shown by black solid circles in the i layer 4 are led to the D electrode the electric field. At the same time, the electrons shown by white circles are injected into the i layer 4. Here, the holes trapped in the interface defect in the interface between the i layer 4 and the insulation layer 70 hardly move, while the electrons are not trapped in the interface defect.

When the above state comes to the state shown in FIG. 16B of the photoelectric conversion operation, since a still larger potential is applied to the D electrode with respect to the G electrode, the electrons in the i layer 4 are led to the D electrode instantly. However, the electrons trapped in the interface defect are almost absent, and the rush current is almost absent which causes a problem with the photoelectric converter of FIG. 10 which has been described before.

Next, after the state, shown in FIG. 16B, of the photoelectric conversion operation continues for a certain period, the state shown in FIG. 16C comes.

In the case in which the condition is refreshed to the condition of $V_{rG} < V_D - V_{FB}$, it rarely happens that the electrons are present in the interface defect in the interface between the i layer 4 and the insulation layer 70, so that it ceases to take a long time for the input and output of the electrons, with the result that the rush current which comes to be a noise component can be largely eliminated.

However, the dynamic range (D·R) of the photoelectric conversion element 100 shown in FIG. 14 under such a refreshment condition becomes $D·R = V_{rG} \times CS$. The dynamic range in the case of $V_{rG} < V_D - V_{FB}$ becomes smaller compared to the case of $V_{rG} > V_D - V_{FB}$. As a consequence, when the signal processing operations are large in number, the generated electric charge caused by the signal light is saturated, thereby lowering the SN ratio.

Figure 17A:
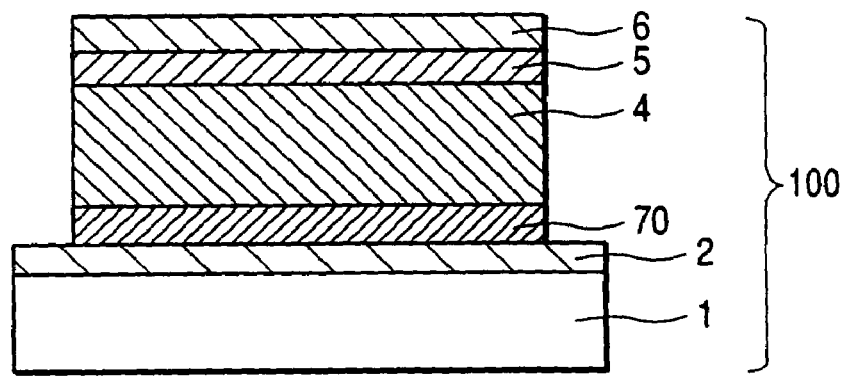
Figure 17B:
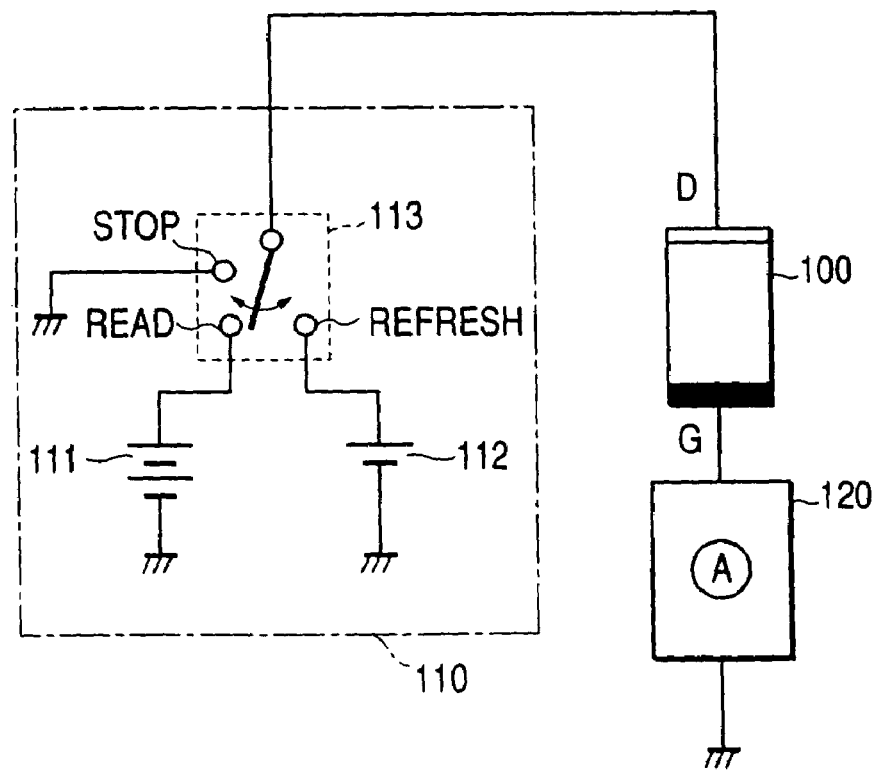

One example of the schematic layer structure drawing and of the schematic circuit drawing of the photoelectric converter are shown in FIGS. 17A and 17B, respectively, for explaining the photoelectric conversion element which is driven under conditions of FIG. 14, FIG. 15 and FIGS. 16A through 16C.

In FIGS. 17A and 17B, parts denoted by the same reference numerals used in FIGS. 6A and 6B denote the same parts. Here, FIGS. 17A and 17B correspond to FIGS. 16A and 16B, respectively. Points in FIG. 17C which are different from FIG. 6B are that the power source connected at the photoelectric conversion mode is replaced with a positive power source 111 having a large voltage difference, and the power source connected at the refreshment mode is replaced with a positive power source 112 having a small voltage difference.

In the circuit operation of FIG. 17B, similarly described in the explanation of FIG. 14, FIG. 15 and FIGS. 16A through 16C, it rarely happens that the electrons are present in the interface defect in the interface between the i layer 4 and the insulation layer 70 and therefore, it ceases to take a long time for the input and output of the electrons. As a result, the rush current which comes to be a noise component can be largely eliminated, thereby making the dynamic range smaller.

In the photoelectric converter described above, the items for maintaining the SN ratio and for stabilizing the property will be explained again.

The refreshment time can be made shorter than the photoelectric conversion time in the case where the one bit circuit shown in FIG. 6B is driven at a timing shown in FIG. 8. In the case where the photoelectric conversion elements are arranged two-dimensionally and are driven in matrix, ratio of the refreshment time and photoelectric conversion time becomes larger with an increase in the number of photoelectric conversion elements.

It is known that the flat band voltage $V_{FB}$ of the MIS type capacitor largely depends on the electric field, time and temperature. In the photoelectric conversion element of the photoelectric converter shown in FIG. 6A, the flat band voltage $V_{FB}$ moves in a positive voltage direction at the time of refresh operation and contrarily the flat band voltage $V_{FB}$ moves in a negative voltage direction at the time of the photoelectric conversion.

Consequently, in the photoelectric conversion element of the photoelectric converter shown in FIGS. 6A and 6B, the flat band voltage $V_{FB}$ moves in the negative voltage direction, thereby minimizing the dynamic range of the photoelectric conversion element. In such a case, the SN ratio of the photoelectric converter becomes smaller, so that stable characteristics cannot be obtained.

Furthermore, in the photoelectric conversion element of the photoelectric converter shown in FIGS. 17A and 17B, the flat band voltage $V_{FB}$ moves in the negative voltage direction at the time both of the refresh operation and the photoelectric conversion, with the result that the flat band voltage $V_{FB}$ moves in the negative voltage direction, thereby minimizing the dynamic range of the photoelectric conversion element. In such a case, the SN ratio of the photoelectric converter becomes smaller and stable characteristic cannot be obtained.

It has been made clear that when the flat band voltage $V_{FB}$ of the photoelectric conversion element of the photoelectric converter moves in the negative voltage direction as described above, there are some cases in which a disadvantage in the characteristics of the photoelectric converter is generated.

FIGS. 18A through 18C are views showing cases in which the conditions are refreshed to a condition of $V_{rG} < V_D - V_{FB}$ in the same manner shown in FIGS. 14, 15, 17A and 17B. In addition, the figures show energy band views of the photoelectric conversion part immediately after a bias under the driving condition is actually applied from the recess mode of the photoelectric conversion element in the case of $V_{FB} < 0$.

FIGS. 18A, 18B, similarly to FIGS. 7A and 7B and FIGS. 16A and 16B, show energy bands of a photoelectric conversion part illustrating the operations of refreshment and photoelectric conversion modes of the photoelectric conversion element 100.

FIG. 18C shows a state in which the GND potential is connected to both ends of the photoelectric conversion element 100, namely the recess mode of the photoelectric conversion element. The state of each of FIGS. 18A through 18C will be explained.

FIG. 18C shows an energy band of a photoelectric conversion part in the state where the flat band voltage $V_{FB}$ is shifted toward a negative voltage direction at the time of refreshment and photoelectric conversion. In FIG. 18C, there is shown the state where the GND potential is connected to both ends of the photoelectric conversion element 100, that is, a photoelectric conversion element recess mode. As shown in the figure, some electrons are then be injected into the interface defect between the i layer and the insulation layer 70. FIG. 18A shows the state after refreshing to a condition of $V_{rG} < V_D - V_{FB}$.

In FIG. 18A, there can be seen that the electrons injected into the interface defect between the i layer and the insulation layer 70 gradually go out toward the D electrode during the photoelectric conversion element recess mode. Since thus movement of electrons is the same as the rush current generated at the time of the transition from the refreshment mode of FIG. 13A to the photoelectric conversion mode of FIG. 13B, electrons trapped in the interface defect in the interface between the i layer 4 and the insulation layer 70 are led to the D electrode, spending a considerable time. As a consequence, even when the state shown in FIG. 18B comes, the rush current continues to flow. In the state shown in FIG. 18B, the current which flows because of this cause is accumulated so that all the current come to be a noise component.

In the present invention, an idling mode is provided to emit electrons injected in the interface defect in the interface between the i layer 4 and the insulation layer 70 or to prevent the injection of electrons in the interface defect in the interface between the i layer 4 and the insulation layer 70. Hereinbelow, as an embodiment of the present invention, there will be explained a case in which the electrons injected in the interface defect in the interface between the i layer 4 and the insulation layer 70 are emitted in the direction of the D electrode during the recess mode of the photoelectric conversion element. Here, injection of the electrons into the interface between the i layer 4 and the insulation layer 70 is a phenomenon which takes place regardless of the presence of the recess mode of the photoelectric conversion element so that an idling mode is required even in the absence of the recess mode of the photoelectric conversion element.

<First Embodiment>

An embodiment which will be explained hereinbelow is the same as the aforementioned photoelectric converter in terms of constitution and operation except for the presence of the idling mode.

Figure 19:
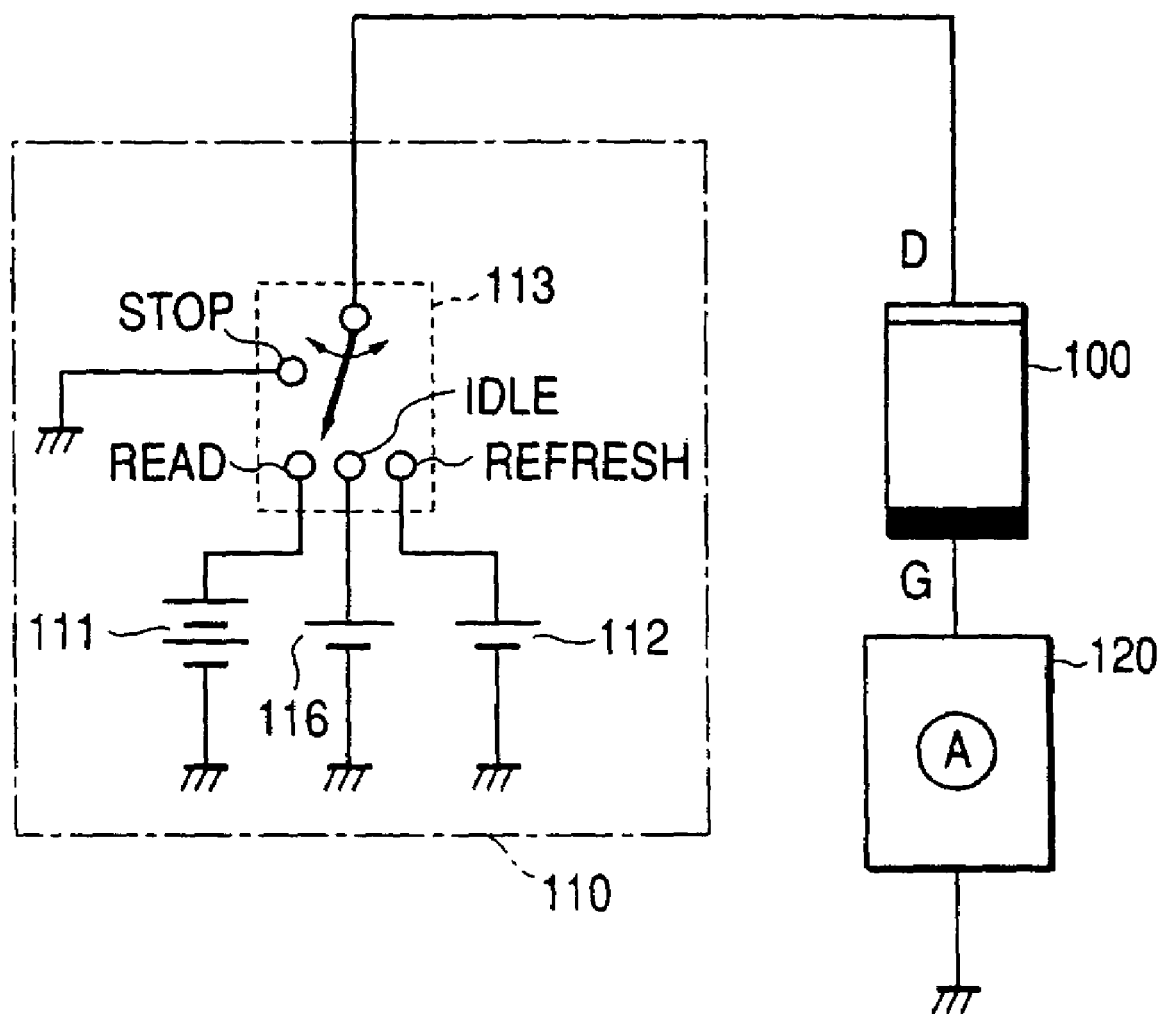
Figure 20:
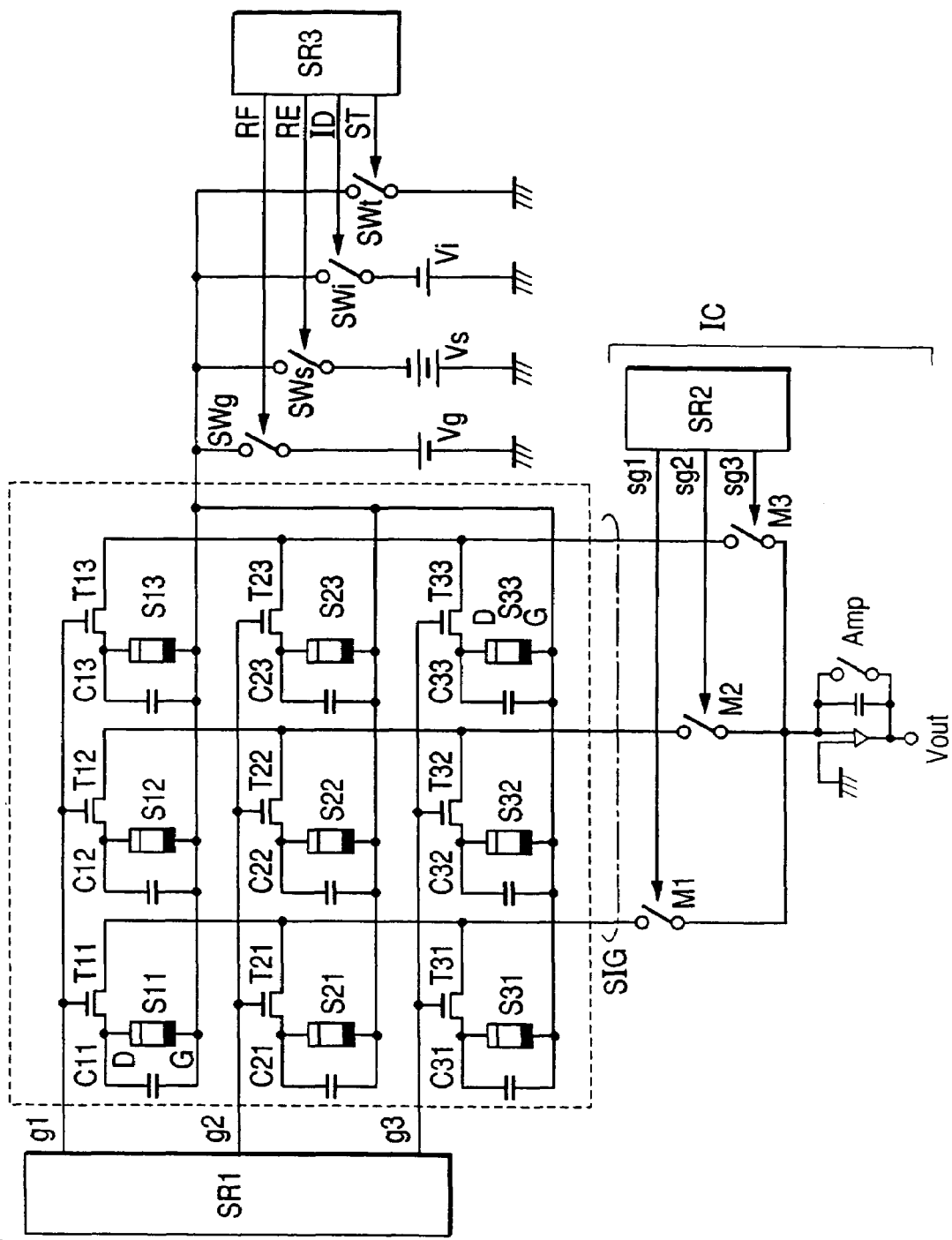

FIG. 19 is a one-bit equivalent circuit diagram of the photoelectric converter according to the first embodiment of the present invention. In FIG. 19, parts denoted by the same reference numerals used in FIG. 17B correspond to the same parts.

The constitution of the equivalent circuit diagram of FIG. 19 is different from FIG. 17B in that an idling mode is provided, namely a state in which a weak electric field is applied to the photoelectric conversion element even when the photoelectric conversion element is not actually used in order to emit the electrons injected in the interface defect in the interface between the i layer 4 and the insulation layer 70 during the recess mode of the photoelectric conversion element in the direction of the D electrode, explained in FIG. 18C.

Specifically, an idle terminal and a positive power source 116 are added to set an idling mode. At the time of the idling mode of the photoelectric conversion element 100, the power source 116 is arranged such that a weak electric field is applied in the same direction at the time of the photoelectric conversion mode. Strictly speaking, a potential difference ($V_{dg}$[idle]) which is obtained by subtracting the potential of the second electrode layer from the potential of the first electrode layer of the photoelectric conversion element at the idling mode is set to a positive value ($0 < V_{dg}$[idle]$ < V_{dg}$[read]) which is smaller than the potential difference ($V_{dg}$[read]) which is obtained by subtracting the potential of the second electrode layer from the potential of the first electrode layer of the photoelectric conversion element at the photoelectric conversion mode.

The reason for the condition of $0 < V_{dg}$[idle]$ < V_{dg}$[read] is that the movement of the flat band voltage $V_{FB}$ toward the direction of the negative voltage more than needed is prevented. On the other hand, the potential relation between the potential difference ($V_{dg}$[idle]) obtained by subtracting the potential of the second electrode layer from the potential of the first electrode layer of the photoelectric conversion element at the idling mode and the potential difference ($V_{dg}$[refresh]) obtained by subtracting the potential of the second electrode layer from the potential of the first electrode layer of the photoelectric conversion element at the refreshment mode is difficult to describe, because $V_{dg}$[refresh] depends on the length of the refreshment time in the refreshment mode.

By providing a circuit shown in FIG. 19, it becomes possible to change the mode of the photoelectric conversion element 100 to the recess mode of the photoelectric conversion element (the state in which a switch 113 is connected to the stop side), to the idling mode (the state in which the switch 113 is connected to the idle side), to the photoelectric conversion mode (the state in which the switch 113 is connected to the read side), and to the refreshment mode (a state in which the switch 113 is connected to the refresh side) to drive the photoelectric conversion element 100 in order. As explained above, while preventing movement of the flat band voltage $V_{FB}$ toward the direction of the negative voltage more than needed, it becomes possible to emit in the direction of the D electrode the electrons injected in the interface defect in the interface between the i layer 4 and the insulation layer 70 during the recess mode of the photoelectric conversion element, whereby the state of S/N can be made a high level which can be instantly used at the start of actual usage thereof. As a consequence, a high quality photoelectric conversion element can be supplied which can be used in a favorable manner, namely, it becomes possible to supply a photoelectric converter which constantly has a high SN ratio and stable characteristics.

<Second Embodiment>

Figure 21A:
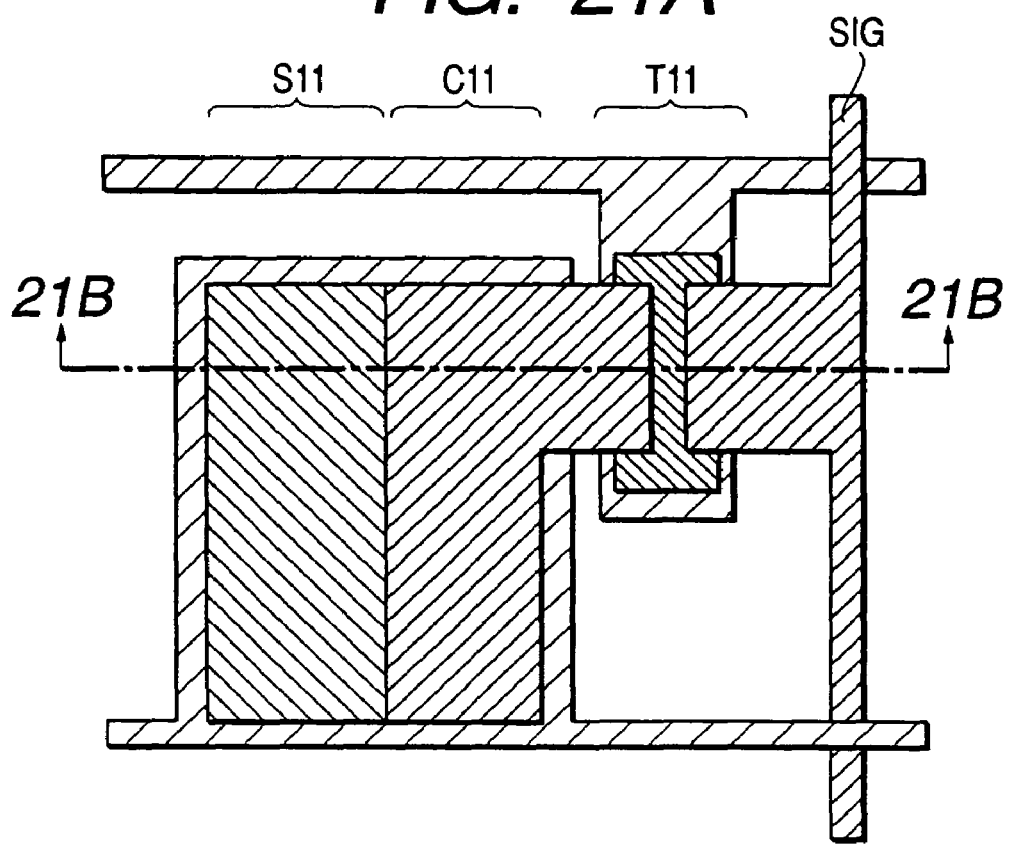
FIG. 21A, FIG. 21B, FIG. 27A and FIG. 27B are views for explaining one preferred example of the photoelectric converter.
Figure 21B:
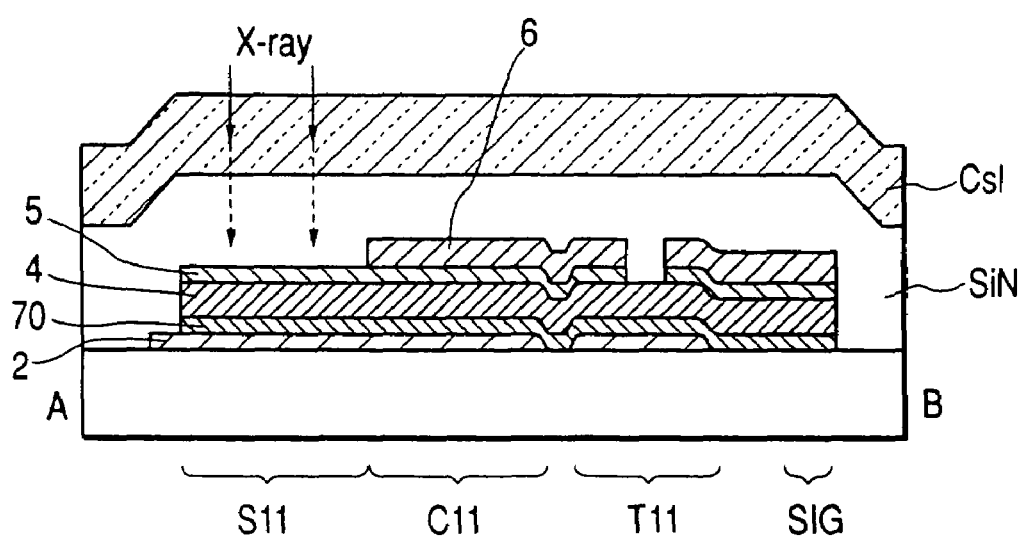

FIG. 20 is an overall circuit diagram showing the photoelectric converter according to the second embodiment of the present invention. FIG. 21A is a schematic plane view for explaining one example of each element corresponding to one pixel in the second embodiment. FIG. 21B is a schematic cross-sectional view taken along the line 21B—21B of FIG. 21A. In FIG. 20, reference numerals S11 through S33 denote a photoelectric conversion element, with G showing a lower electrode side and D showing an upper electrode side. Reference numerals C11 through C33 denote capacitors for accumulation. Reference numerals T11 through T33 denote a TFT for transmission. Symbol Vs denotes a power source for reading. Symbol Vg denotes a power source for refreshing. Symbol Vi denotes an idling power source. The GND potential is the potential for recess of the photoelectric conversion element. Each of the power sources and the GND potential are connected to the G electrode of all the photoelectric conversion elements S11 through S33 via each of the switches SWs, SWg, SWi and SWt. Here, the potential of each of the power sources which is applied to the G electrode of the sensor is set to $0 > Vg > Vs$ and 0>Vi>Vs. The switches SWs, SWg, SWi and SWt are directly connected to a shift register SR3. The switches Sws, Swg, Swi and Swt are controlled such that the switches are not turned on at the same time. The on time of each of the switches can be set arbitrary.

One pixel is constituted of one photoelectric conversion element, a capacitor and a TFT. The signal output is connected to the integrated circuit IC for detection by the signal wiring SIG. In the photoelectric converter according to the second embodiment, a total of nine pixels are divided into three blocs and an output of three pixels per one bloc is simultaneously transmitted and is successively converted into output ($V_{out}$) by the integrated circuit IC for detection through this signal wiring SIG. Three pixels in one bloc are arranged in a horizontal direction and three blocs are successively arranged in a vertical direction, whereby each pixel is arranged two-dimensionally.

Parts surrounded by a broken line in the drawings are formed on the same insulation substrate having a large area. Of the parts, a part corresponding to the first pixel is shown in a schematic plane view of FIG. 21A. Furthermore, a part is shown in a schematic cross-sectional view of FIG. 21B taken along the broken line 21B—21B in FIG. 21A. Reference numeral S11 denotes a photoelectric conversion element. Reference numeral T11 denotes a TFT. Reference numeral C11 denotes a capacitor. Reference numeral SIG denotes signal wiring. In the present embodiment, the capacitor C11 and the photoelectric conversion element S11 are not particularly separated in terms of device. By enlarging an area of the electrode of the photoelectric conversion element S11, the capacitor C11 is formed. This can be made possible because the photoelectric conversion element according to the second embodiment and the capacitor have the same layer structure. Moreover, on the upper part of the pixel, a silicon nitride SiN film for passivation and a phosphor CsI such as cesium iodine are formed. When the X-ray is entered from the upper side, the phosphor CsI is converted into light (shown by a broken line arrow) so that the light is entered into the photoelectric conversion element.

Next, an operation of the aforementioned photoelectric conversion element will be explained by using FIGS. 20 through 22.

Figure 22:
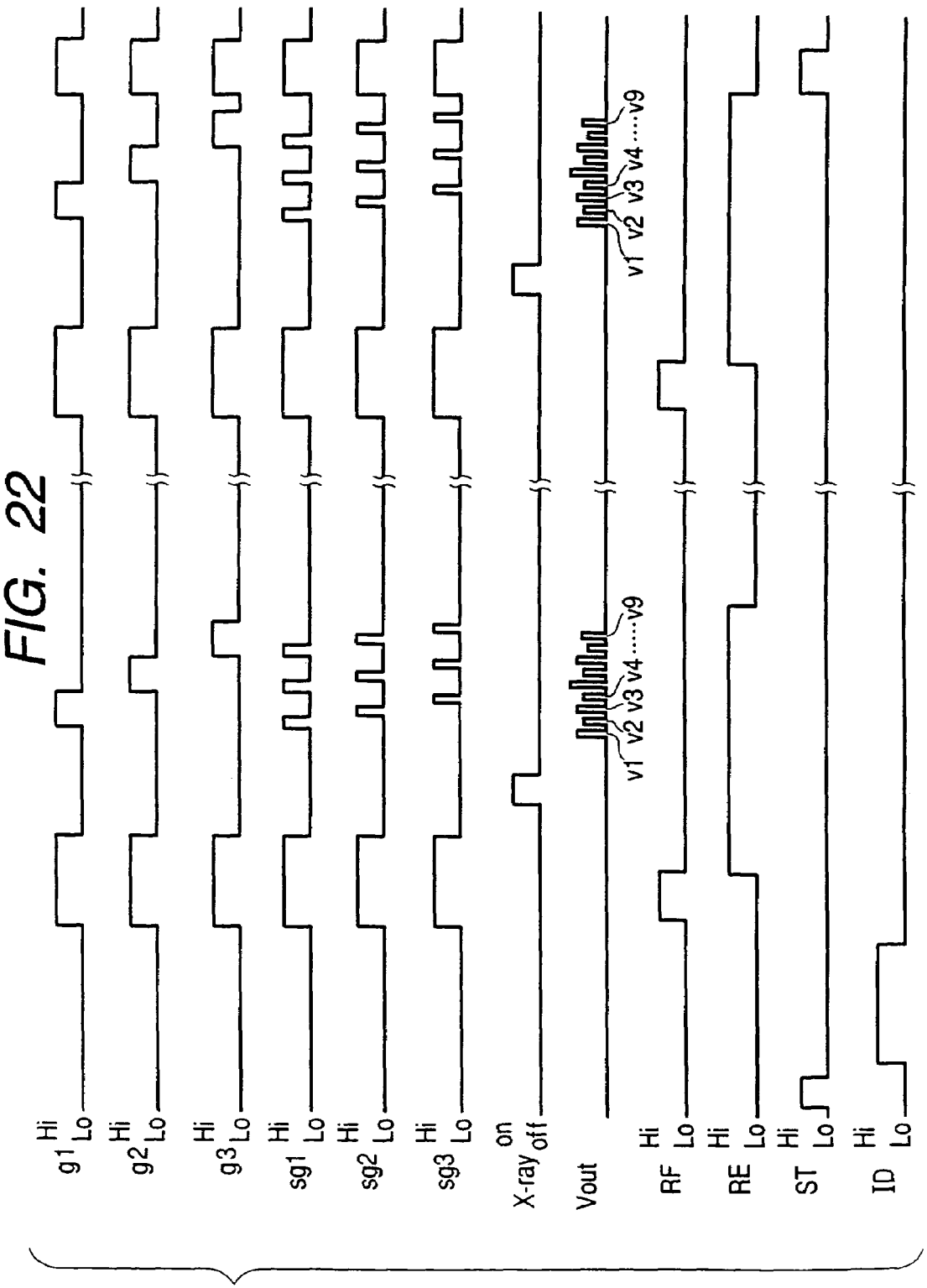

FIG. 22 is a timing chart showing one example of the operation of the present embodiment.

In the beginning, the ST signal of a shift register SR3 is set at a high state, and all the photoelectric conversion elements S11 through S33 are set at a recess state. The ID signal of the shift register SR3 comes to be a high state from this state, and the electrons injected in the interface defect in the interface between the i layer 4 and the insulation layer 70 of all the photoelectric conversion elements S11 through S33 are emitted in the direction of the D electrode.

After that, Hi is applied to the control wirings g1 through g3, sg1 through sg3 by the shift registers SR1 and SR2. Then the TFT·T11 through T33 for transmission and the switches M1 through M3 are turned on to be set to an ON state, and the D electrodes of all the photoelectric conversion elements S11 through S33 become the GND potential (because the input terminal of the integral detector Amp is designed to be a GND potential). At the same time, the shift register SR3 outputs Hi to the RF so that the switch SWg is turned on and the G electrodes of the photoelectric conversion elements S11 through S33 come to be the potential of the power source Vg for refreshment. After that, all the photoelectric conversion elements S11 through S33 are set to a refreshment mode to be refreshed. Next, the shift register SR3 outputs LO to RF and outputs Hi to RE. The switch SWg is turned off and the switch SWs is turned on and the G electrodes of all the photoelectric conversion elements S11 through S33 become a negative potential by the power source Vs for reading. Then, all the photoelectric conversion elements S11 through S33 got into a photoelectric conversion mode, and capacitors C11 through C33 are simultaneously initialized. Then LO is applied to control wirings g1 through g3 and sg1 through sg3 by the shift registers SR1 and SR2 at this state. Then the TFT·T11 through T33 for transmission and switches M1 through M3 are turned off, and the D electrodes of all the photoelectric conversion elements S11 through S33 become open in terms of DC, but the potential is maintained by capacitors C11 through C33. However, at this time, an X-ray is not entered, with the result that light is not entered to all the photoelectric conversion elements S11 through S33 so that photoelectric current does not flow. Furthermore, during the recess mode of the photoelectric conversion element, since electrons injected in the interface defect in the interface between the i layer 4 and the insulation layer 70 are emitted in the direction of the D electrode, the rush current (which comes to be a noise component) is not generated, so that it is made a high level of usable S/N.

An X-ray is emitted in terms of a pulse at this state to pass through the human body or the like. Then the X-ray is entered into the phosphor CsI to be converted into light. The light is entered to the respective photoelectric conversion elements S11 through S33. The light includes information on the internal structure of the human body or the like. The photoelectric current which flows due to this light is accumulated in respective capacitors C11 through C33 as electric charges to be maintained after the termination of the entrance of the X-ray. Next, a control pulse Hi is applied to the control wiring g1 by means of the shift register SR1, and the voltages v1 through v3 are successively output through the TFT·T11 through T33 for transmission and the switches M1 through M3 by application of a control pulse to the control wirings sg1 through sg3 of the shift register SR2. As a consequence, two dimensional information on the internal structure of the human body or the like can be obtained as the voltages V1 through V9.

After that, RE of the shift register SR3 comes to be LO.

In the case where a still image is needed, the operations are stopped here. The operations up to this steps are repeated in the case where an animated image is needed. In the last timing chart of FIG. 22, it can be seen that the same signal at the start of operation is entered to the photoelectric conversion elements S1 through S33 with the result that the same signal as at the start of operation is output to the voltages v1 through v9 of $V_{out}$. Then, at the last step of the operation, the ST signal of the shift register SR3 is set again to a state of Hi so that all the photoelectric conversion elements S11 through S33 are set to a recess state.

Figure 23:
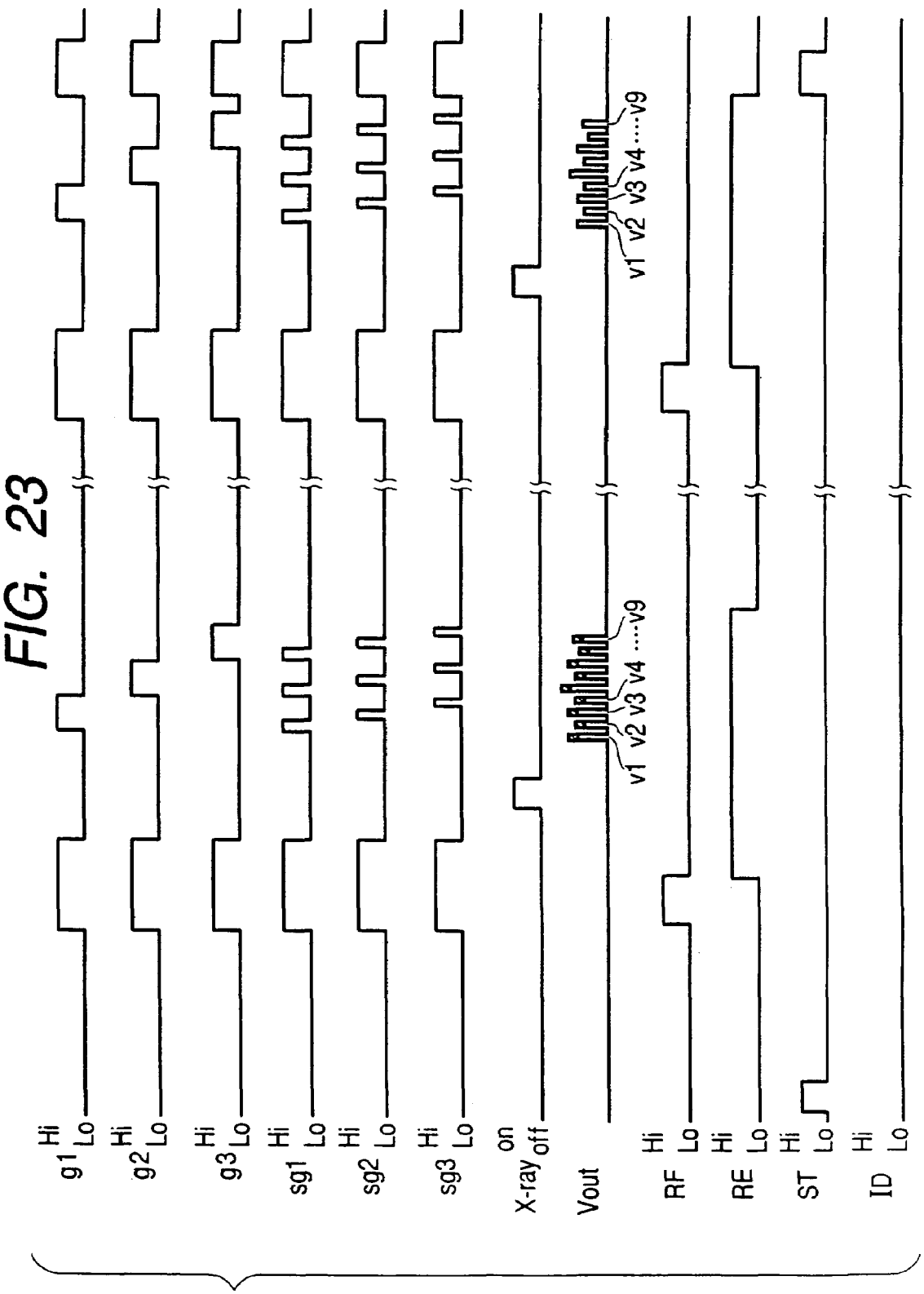

Here, for a comparison of operation, there is shown in FIG. 23 a case in which the photoelectric conversion element is not set to an idling mode.

FIG. 23 is a timing chart showing an operation of the present embodiment similarly to FIG. 22. What is different from FIG. 22 is as follows. The ST signal of the shift register SR3 is set to a state of Hi in the beginning. After all the photoelectric conversion elements S11 through S33 are set to a recess state, the ID signal of the shift register SR3 does not come to be the state of Hi, and the electrons injected into the interface defect in the interface between the i layer 4 and the insulation layer 70 of all the photoelectric conversion elements S11 through S33 are not emitted toward the direction of D the electrode.

Therefore, the same signal as in FIG. 22 is entered toward the photoelectric conversion elements S11 through S33 with the result that the same signal as at the time of the start of operation ought to be output to voltages v1 through v9 of $V_{out}$. However, it has been made clear that a correct output value is not represented by the electric charge of the rush current, which is a noise component of the part shown by slanted lines. While, it has been made clear that when a similar operation continues, a normal signal is output to $V_{out}$ at the voltages V1 through V9.

In the photoelectric converter according to the present embodiment, similarly to the first embodiment, the photoelectric conversion elements S11 through S33 can be driven by switching the recess mode of the photoelectric conversion elements, the idling mode, the photoelectric conversion mode and the refreshment mode in order. As explained above, while preventing the flat band voltage $V_{FB}$ from moving toward a negative voltage more than needed, it is possible to emit the electrons injected in the interface defect in the interface between the i layer 4 and the insulation layer 70 in the direction of the D electrode during the recess mode of the photoelectric conversion mode, and further, the state of Hi S/N which can be instantly used can be made high with the result that a high quality photoelectric conversion element which can be favorably used can be supplied and a photoelectric converter constantly having a high SN ratio and stable characteristics can be supplied.

In the present embodiment, the G electrode of the photoelectric conversion element is commonly connected, and this common wiring is connected to the power source Vg for refreshment, a power source Vs for reading, power source Vi for idling and the GND potential for the recess of the photoelectric conversion element via the switches SWg, SWs, SWi and SWt with the result that all the photoelectric conversion elements can be switched to the refreshment mode, the photoelectric conversion mode, the idling mode and the recess mode of the photoelectric conversion elements at the same time. Consequently, the light output can be obtained per one pixel with one TFT without complicated control.

In the present embodiment, nine pixels having a 3×3 configuration are arranged two-dimensionally and three pixels are each divided three times to be transmitted and to be output. However, the embodiments are not limited thereto. For example, an X-ray detector having a size of 40 cm×40 cm is obtained when, for example, 5×5 pixels per 1 mm both vertical and horizontal directions are arranged two-dimensionally as 2000×2000 pixels. This is combined with an X-ray generator in place of X-ray film to constitute an X-ray Roentgen apparatus which can be used for Roentgen diagnosis of the chest, for the diagnosis of cancer of the breast and for non-destruction testing of body. In doing so, unlike films, the output can be instantly displayed on an image output device such as a CRT or the like. Furthermore, the output can be converted into digital signals to be converted into an output, matching the purpose, through image processing by a computer. Furthermore, the image can be stored on an opto-magnetic disc and past images can be instantly retrieved. Furthermore, the sensitivity is favorable compared with film, and a clear image can be obtained with a weak X-ray which has little influence on the human body.

Figure 24:
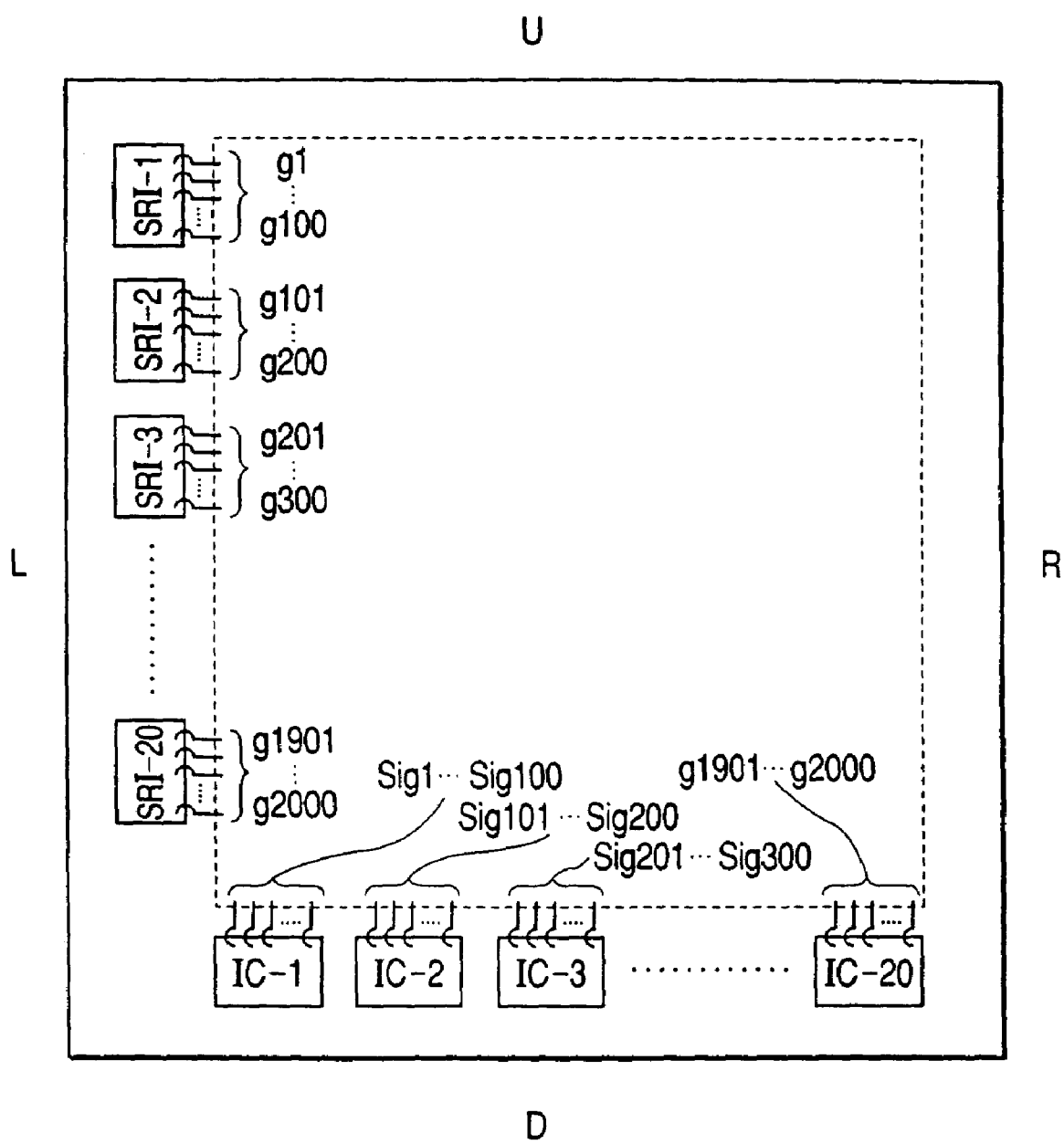
FIG. 24 and FIG. 25 are views for explaining one preferred example of the mounted photoelectric converter, respectively.
Figure 25:
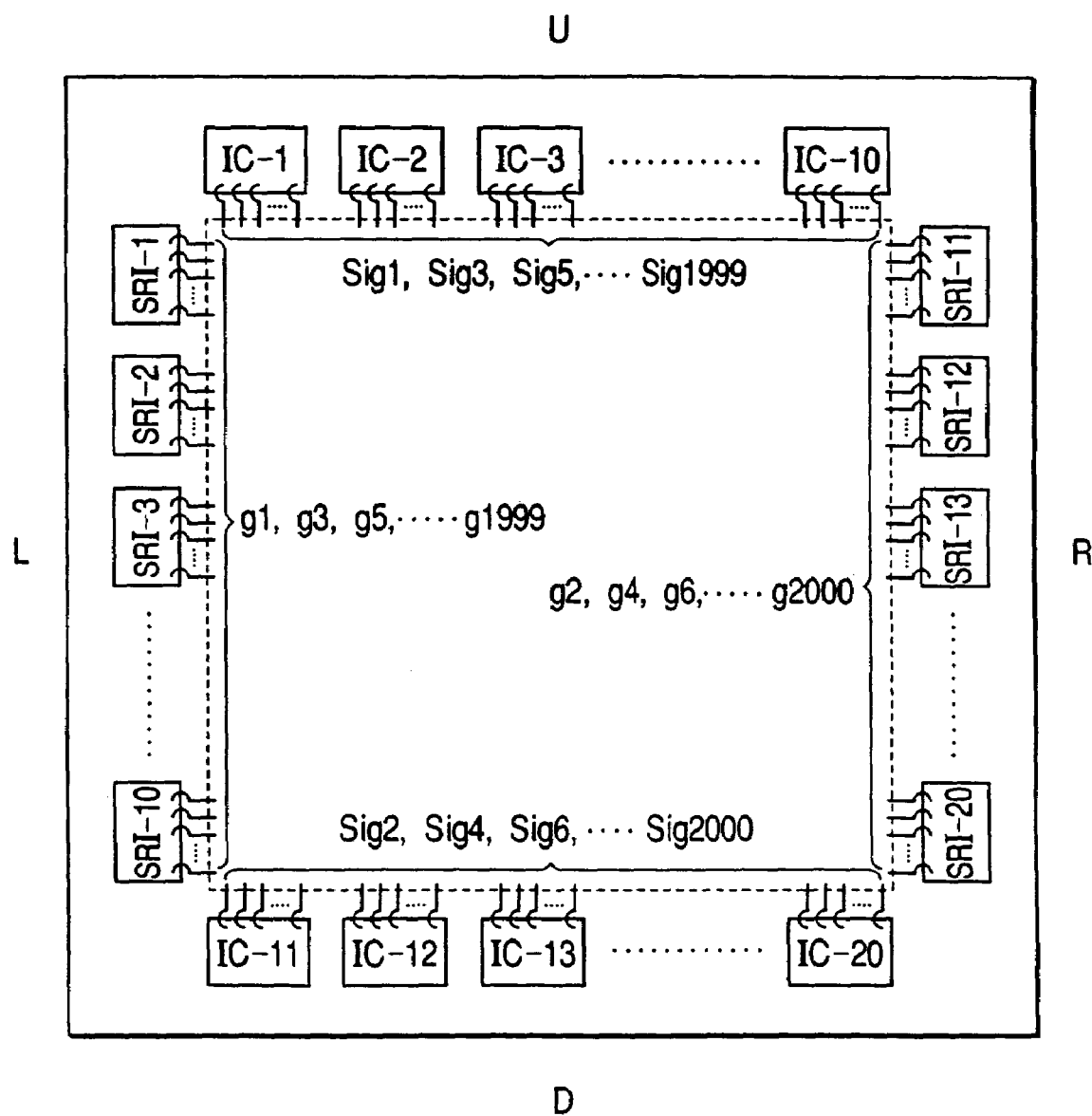

FIG. 24 and FIG. 25 are conceptual views showing one example of mounting a detector having 2000×2000 pixels. In the case where 2000×2000 detectors are constituted, the elements in the broken lines shown in FIG. 20 may be increased in number in both the vertical and horizontal directions. In this case, the wirings become 2000 as described, as g1 through g2000. The signal wirings SIG also become 2000 in number as described, as sig1 through sig2000. Furthermore, the shift register SR1 and the integrated circuit IC for detection must control and process 2000 wirings so that the scale thereof becomes very large. Doing this with one chip device is disadvantageous in terms of production yield, price and the like because one chip becomes very large. Therefore, the shift register SR1 is formed, for example, on one chip for 100 steps so that 20 devices (SR1-1 through SR1-20) may be used. Furthermore, the integrated circuit for detection is formed on one chip for each of 100 processing circuits and 20 circuits (IC1 through IC20) are used.

FIG. 24 shows a state in which 20 chips (SR1-1 through SR1-20) are mounted on the left side (L) and 20 chips are mounted on the lower side (D) so that 100 control wirings and signal wirings per chip are connected to the chip by means of wire bonding. The broken line part in FIG. 24 corresponds to the broken line in FIG. 20. Connection to the outside is omitted. SWg, SWs, SWi, Vg, VS, Vi, RF and the like are also omitted. Although there are 20 outputs ($V_{out}$) from the integrated circuit IC1 through IC20, the integrated circuits are bundled into one circuit via a switch or the like, or 20 circuits are output as they are for parallel processing.

Otherwise, as shown in FIG. 25, 10 chips (SR1-1 through SR1-10) are mounted on the left side (L) while 10 chips (SR1-11 through SR1-20) are mounted on the right side (R) and 10 chips (IC1 through IC10) are mounted on the upper side (U) while 10 chips (IC11 through IC20) are mounted on the lower side (D). Since in this configuration, 1000 wiring lines each are apportioned to the upper, lower, left and right sides (U·D·L·1R), the density of the wiring in each side becomes small and the density of the wire bonding becomes small and the yield is improved. The wirings are allocated to g1, g3, g5, . . . g19999 on the left side (L) and g2, g4, g6, . . . g2000 on the right side (R). That is, control lines with odd numbers are allocated on the left side (L) and control lines with even numbers are allocated on the right side (R). This provides further improved yield without any concentration of density since each of the wirings is drawn and routed at regular intervals. The wiring to the upper side (U) and to the lower side (D) may be allocated in the same manner. Furthermore, as another embodiment (not shown), the allocation of the wiring may be separated into g1 through g100, g201 through g300, . . . , g1801 through g1900 on the left side (L) and g101 through g200, g301 through g400, . . . g1901 through g2000 on the right side (R). In other words, a continuous control line for each chip is separated, and the control lines are separated alternately on the left and the right sides (L·R). In this manner, the inside of one chip can be continuously controlled so that the driving timing is easy and a cheap device can be obtained, without complicating the circuit. The same can be applied to the upper side (U) and the lower side (D), whereby continuous processing can be made possible and a cheap circuit can be used.

As shown in FIG. 24 and FIG. 25, after the circuit of the broken line portion is formed on one substrate, a chip may be mounted on the substrate. Otherwise, the circuit substrate of the broken line portion and a chip may be formed on another large substrate. Furthermore, the chip is mounted on a flexible substrate and may be bonded to the circuit substrate of the broken line portion to be connected thereto.

A photoelectric converter having a large area with a very large number of pixels could not be formed by complicated steps using conventional optical sensors. However, number of the steps for forming the photoelectric converter according to the present invention are small because the respective devices are simultaneously formed with a common film. Due to the simple steps, a high yield can be obtained, and a photoelectric converter having a large area and a high performance can be produced at a low cost. Furthermore, the capacitor and the photoelectric conversion element can be constituted in the same device so that number of the devices can be reduced by half, whereby the yield can be further improved.

<Third Embodiment>

Figure 26:
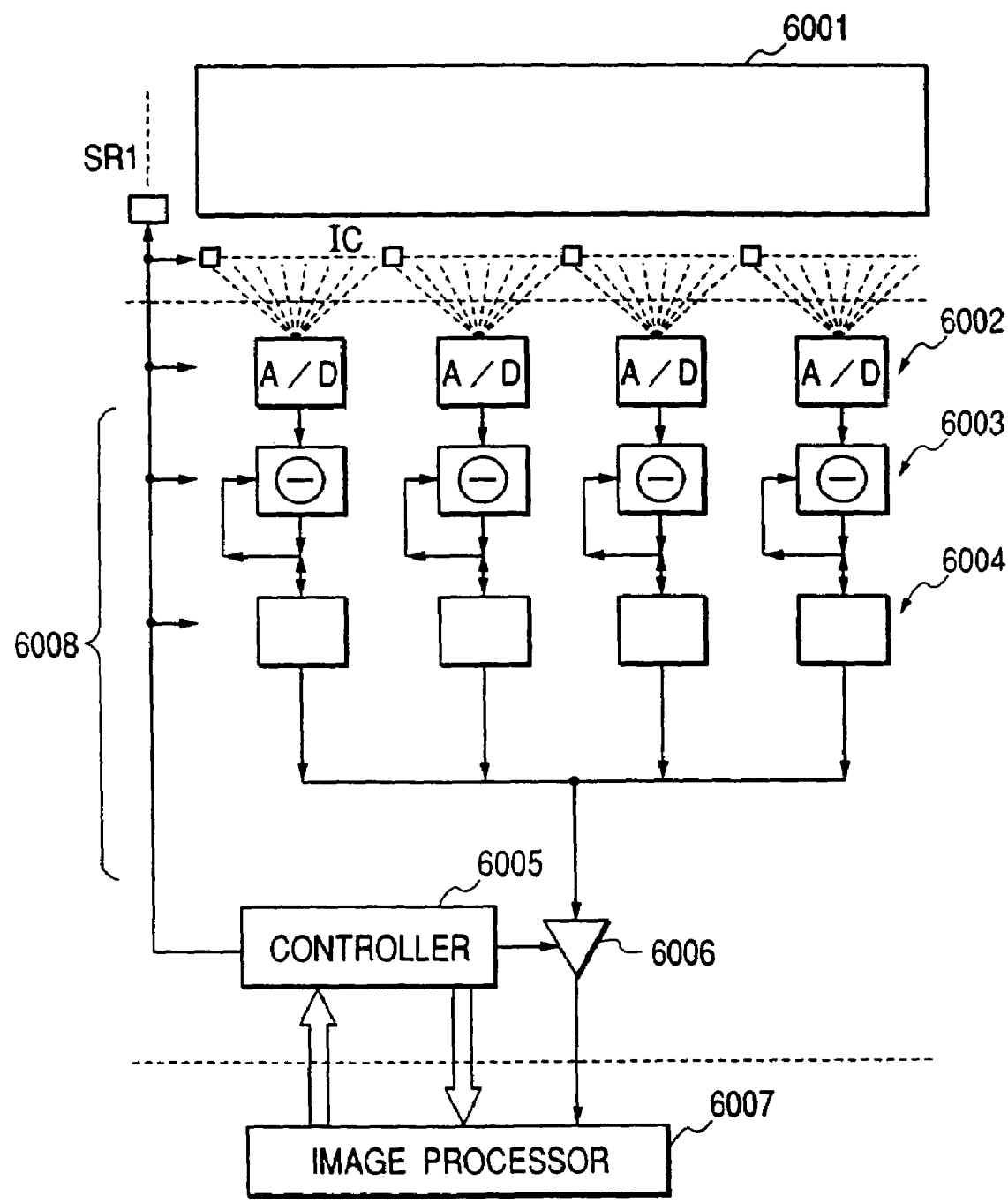
FIG. 26 and FIG. 28 are views for explaining one preferred example of a system having the photoelectric converter.

FIG. 26 is a schematic bloc view showing a system as a whole using the photoelectric converter of the present invention. Reference numeral 6001 denotes an a-Si sensor substrate. In this view, a plurality of shift registers SR1 are arranged in series, and a plurality of integrated circuits for detection IC are also driven. The output of the integrated circuits for detection IC is input to an analog-digital converter 6002 in the processing circuit 6008 to be digitalized. This output is memorized in a memory 6004 via a subtractor 6003 for correction of a fixed pattern. The information in the memory is controlled by a controller 6005 to be transmitted to an image processor as a signal processing means via a buffer 6006.

Figure 27A:
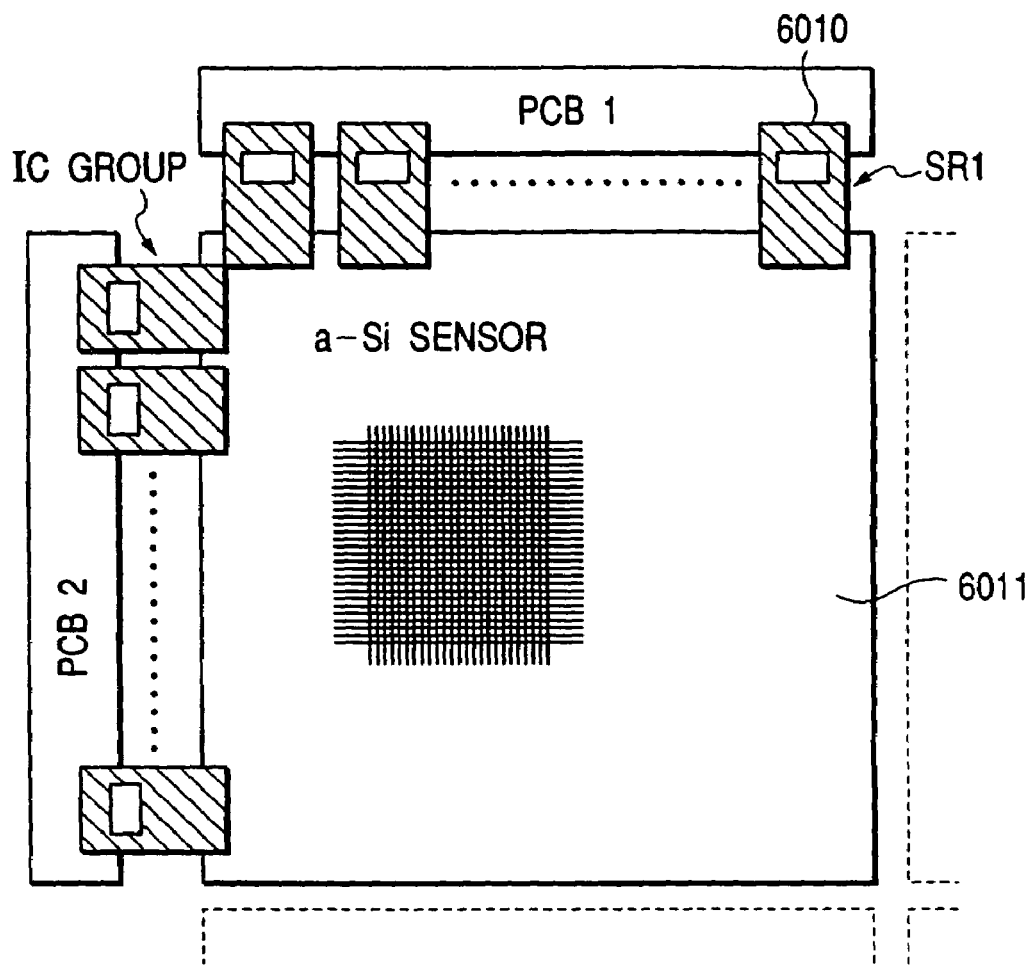
Figure 27B:
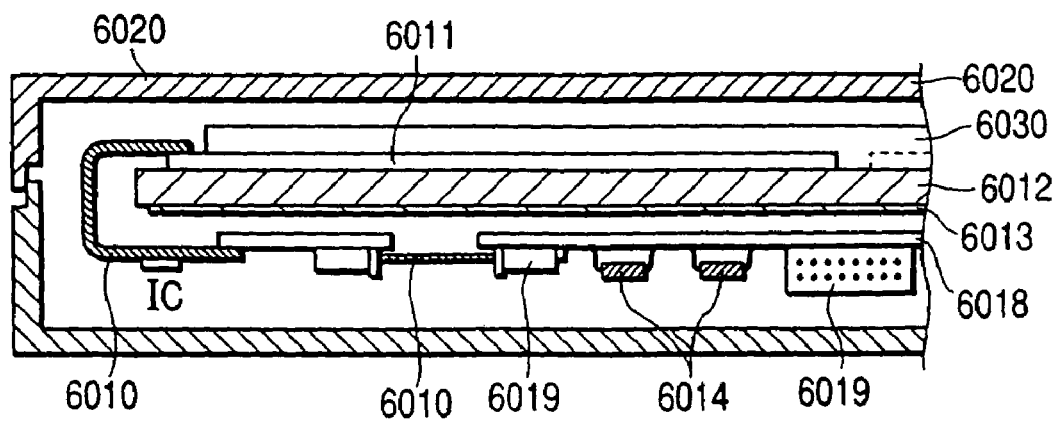

FIGS. 27A and FIG. 27B are a schematic structural view and a schematic cross-sectional view, respectively, in the case where the present invention is applied to the photoelectric converter for the detection of X-rays.

Figure 2:
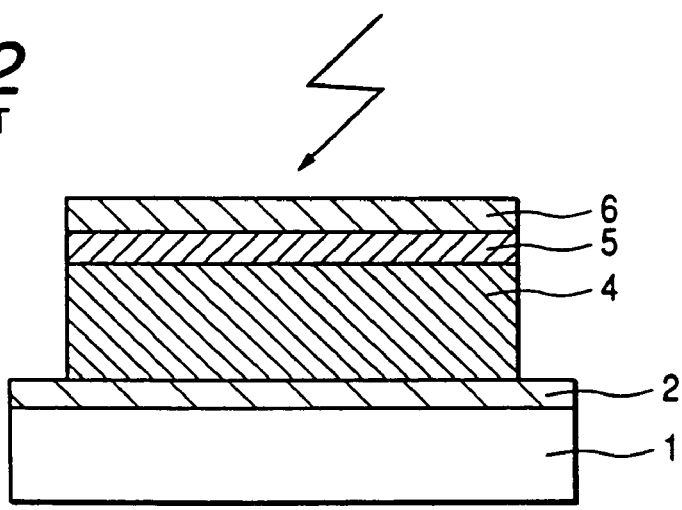
Figure 3:
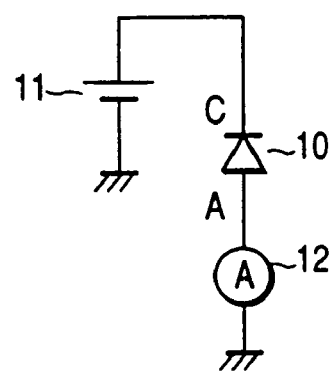
FIG. 3, FIG. 6B, FIG. 17B and FIG. 19 are diagrams of schematic circuit for operating the photoelectric conversion element.
Figure 4:
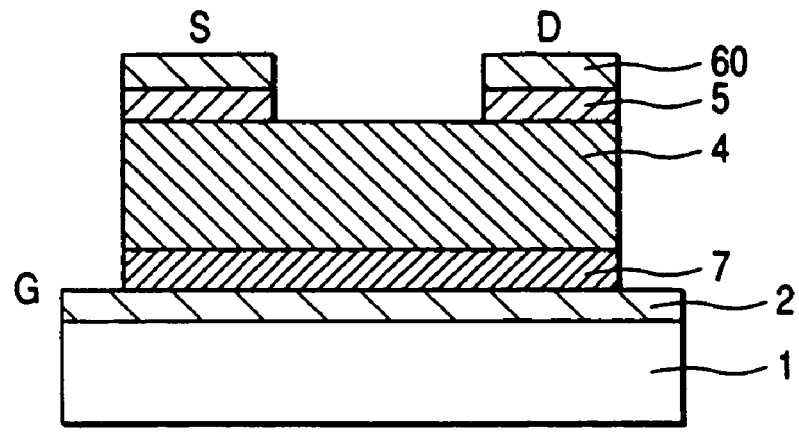
FIG. 4 is a schematic sectional view showing one structural example of a thin film transistor (TFT).
Figure 5:
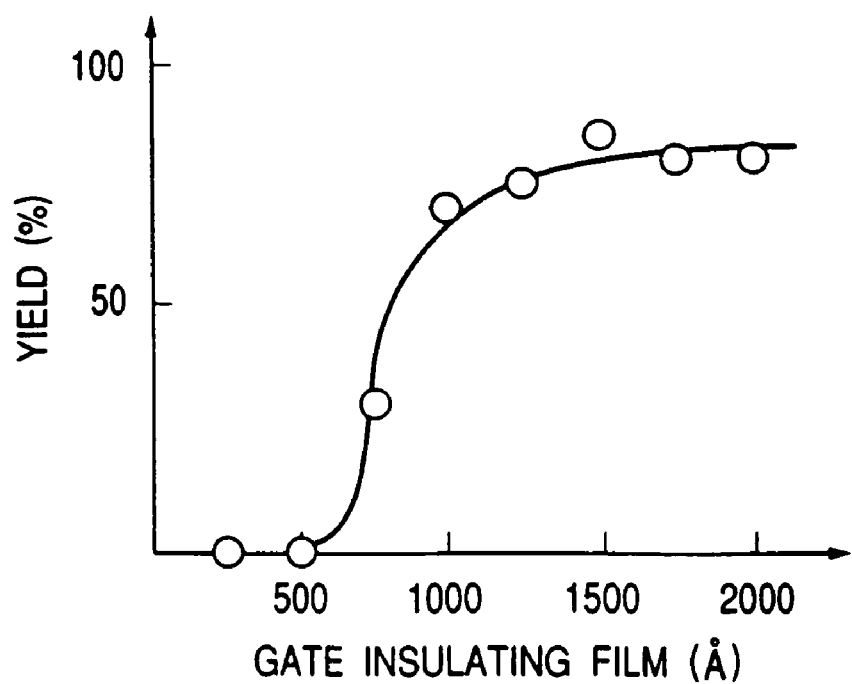
FIG. 5 is a graph showing one example of the relation between the gate insulation film of the TFT and yield.

The photoelectric conversion element and the TFT are connected to flexible circuit substrates 6010 formed in plurality in the a-Si sensor substrate 6011 and mounted the shift registers SR1 and integrated circuits for detection IC. An opposite side of the flexible circuit substrate 6010 is connected to the circuit substrates PCB1 and PCB2. A plurality of the aforementioned a-Si sensor substrates 6011 are bonded to the base member 6012 and a lead plate 6013 for protecting a memory 6014 in the processing circuit 6018 from X-rays is mounted on the lower part of the base member 6012 which constitutes a large photoelectric converter. A phosphor 6030 such as CsI for converting X-rays into visible light is applied or plastered or, the a-Si sensor substrate 6011. On the basis of the principle which is the same as the X-ray detection method, explained in FIG. 2, X-rays can be detected. In the present embodiment, as shown in FIG. 27B, the whole part is stored in a carbon-fiber case 6020.

Figure 28:
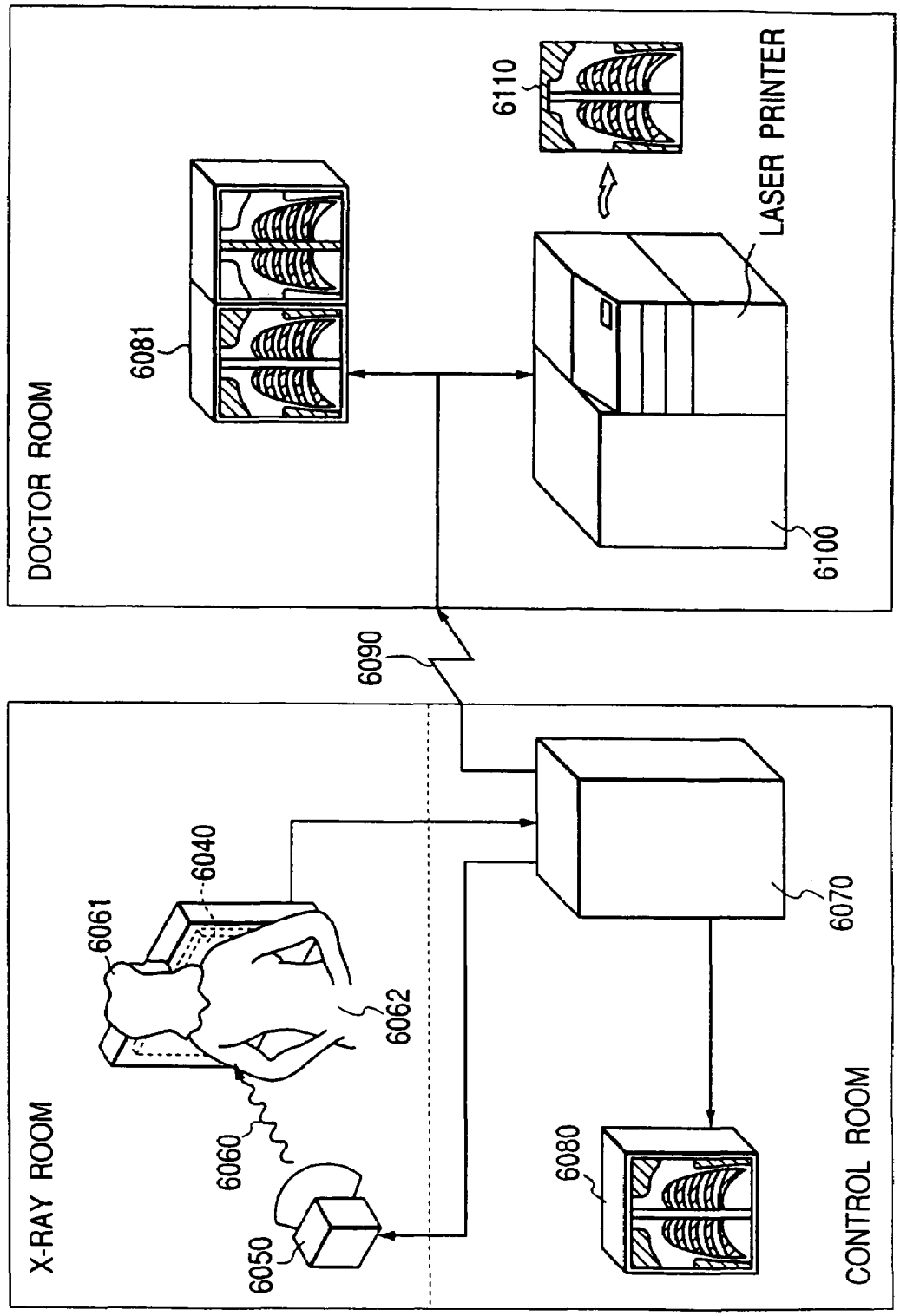

FIG. 28 is a view showing an application example of the photoelectric converter of the present invention to an X-ray diagnosis system.

An X-ray 6060 generated in an X-ray tube 6050 passes through a chest part 6062 of a patient or an experiment object 6061 and entered into the photoelectric converter 6040 in which the phosphor is mounted on its upper part. This entered X-ray includes information on the inside of the body of the patient 6061. The phosphor emit light corresponding to entrance of the X-ray and the light is photoelectrically converted to obtain electric information. This information is digitally converted and is subjected to image processing by means of the image processor 6070 and can be observed on a display 6080 in the control room.

Furthermore, this information can be transmitted to a remote place by a transmission means such as a telephone circuit 6090 or the like, and can be displayed on a display 6081 in a separate place such as a doctor's room and can be stored on storage means such as an optical disc or the like, doctors at a remote place can diagnose. In addition, the information can be recorded on a film 6110 by means of a film processor 6100.

As explained above, according to the photoelectric converter of the present invention, the idling mode, the refreshment mode and the photoelectric conversion mode can be switched and driven. While preventing the flat band voltage $V_{FB}$ from moving in a negative voltage direction more than needed, electrons, for example, electrons injected into the interface defect in the interface between the photoelectric conversion semiconductor layer and the insulation layer during a recess mode of the photoelectric conversion element mode, can be emitted toward the second electrode direction. It is possible to provide a high state of S/N which can be instantly used at the start of actual usage, with the result that a high quality photoelectric conversion element which can be favorably used can be supplied. Therefore, a photoelectric converter having a constantly high SN ratio and stable characteristics, a driving method thereof and a system including the photoelectric converter can be supplied.

Furthermore, by employing a photoelectric converter having the excellent characteristics as described above, a facsimile machine with a large area, high functionality and high characteristics, and a non-destruction test apparatus exemplified by an X-ray roentgen apparatus can be provided at low cost.

The invention claimed is:

1. A method for obtaining an image using a radiation projection imaging system including a radiation source and a converter, said converter having a plurality of conversion elements one-dimensionlly or two-dimensionlly arranged and switching elements connected to the respective conversion elements, the method comprising:
   a first step of applying an electric field to the conversion elements for discharging an electric charge from the conversion elements;
   a second step of discharging the electric charge by operating the switching elements after the first step;
   a third step of providing the conversion elements with a negative potential;
   a fourth step of irradiating the converter with radiation from the radiation source after the third step; and
   a fifth step of outputting a signal from the converter having image information converted from the radiation.

2. The method according to claim 1, wherein the electric field is weaker than and has the same direction as an electric field of the output of the conversion element in the fifth step.

3. The method according to claim 1, wherein the first step to the fifth step are repeated plural times.

4. The method according to claim 1, the conversion elements are photoelectric conversion elements, the switching elements are a thin film transistors, and the converter is a photoelectric conversion device.

5. The method according to claim 4, wherein the photoelectric conversion device comprises the photoelectric conversion elements each comprising a stack of a first electrode layer; an insulating layer for blocking passage of both of a first type carrier and a second type carrier different from the first carrier; a photoelectric conversion semiconductor layer; an injection blocking layer for blocking injection of the first type carrier to the photoelectric conversion semiconductor layer; and a second electrode layer.

6. The method according to claim 4, wherein the photoelectric conversion device further comprises a phosphor for converting radiation into light which can be perceived by the photoelectric conversion element.

7. The method according to claim 4, wherein the photoelectric conversion elements and the thin film transistors comprise amorphous silicon.

* * * * *

UNITED STATES PATENT AND TRADEMARK OFFICE
CERTIFICATE OF CORRECTION

PATENT NO.       : 7,009,164 B2
APPLICATION NO.  : 11/030876
DATED            : March 7, 2006
INVENTOR(S)      : Isao Kobayashi et al.

It is certified that error appears in the above-identified patent and that said Letters Patent is hereby corrected as shown below:

ON THE TITLE PAGE [54]:

Title, "CONVERTER METHOD" should read --CONVERTER, METHOD--.

COLUMN 1:

Line 1, "CONVERTER" should read --CONVERTER,--.

COLUMN 2:

Line 21, "respectively" should read --respectively,--; and
Line 42, "inafter-referred" should read --inafter referred--.

COLUMN 6:

Line 3, "FIG. 6A, FIG. 17A" should read --FIG. 6A and FIG. 17A--;
Line 7, "circuit" should read --circuits--; and
Line 13, FIG. 7A,." should read --FIG. 7A,-- and
         "FIG. 126," should read --FIG. 12B,--.

COLUMN 7:

Line 12, "potential,. and" should read --potential, and--; and
Line 50, "respective" should read --respect--.

COLUMN 9:

Line 21, "of" (first occurrence) should read --the--.

COLUMN 10:

Line 6, "the-detection" should read --the detection--.

COLUMN 12:

Line 28, "made" should read --be made--.

UNITED STATES PATENT AND TRADEMARK OFFICE
CERTIFICATE OF CORRECTION

PATENT NO. : 7,009,164 B2
APPLICATION NO. : 11/030876
DATED : March 7, 2006
INVENTOR(S) : Isao Kobayashi et al.

It is certified that error appears in the above-identified patent and that said Letters Patent is hereby corrected as shown below:

COLUMN 13:

Line 5, "respective" should read --respect--;
Line 15, "considerable" should read --considerable amount--;
Line 26, "electrons-trapped" should read --electrons trapped--; and
Line 62, "are" should read --is--.

COLUMN 14:

Line 37, "amount" should read --an amount--; and
Line 51, "some" should read --same--.

COLUMN 15:

Line 42, "$V_{rG}>V_D-V_{FB}$." should read --$V_{rG} \geq V_D-V_{FB}$.--.

COLUMN 17:

Line 4, "be" should read --to be--.

COLUMN 20:

Line 6, "got" should read --are put.-;
Line 46, "this" should read --these-.; and
Line 50, "S1" should read --S11--.

COLUMN 23:

Line 1, "number" should read --a number--;
Line 8, "number" should read --a number--;
Line 31, "mounted" should read --mounted on--; and
Line 41, "or," should read --on--.

UNITED STATES PATENT AND TRADEMARK OFFICE
CERTIFICATE OF CORRECTION

PATENT NO. : 7,009,164 B2
APPLICATION NO. : 11/030876
DATED : March 7, 2006
INVENTOR(S) : Isao Kobayashi et al.

It is certified that error appears in the above-identified patent and that said Letters Patent is hereby corrected as shown below:

<u>COLUMN 24</u>:

Line 46, "the" should read --wherein the--; and
    Line 48, "a" should be deleted.

Signed and Sealed this

Seventeenth Day of October, 2006

JON W. DUDAS
*Director of the United States Patent and Trademark Office*